(12) United States Patent
Lin et al.

(10) Patent No.: US 7,724,090 B2
(45) Date of Patent: May 25, 2010

(54) LOOP CONTROL APPARATUS AND METHOD THEREOF

(75) Inventors: Yu-Hsuan Lin, Taichung (TW); Yuh Cheng, Hsin-Chu Hsien (TW)

(73) Assignee: Mediatek Inc., Hsin-Chu (TW)

( * ) Notice: Subject to any disclaimer, the term of this patent is extended or adjusted under 35 U.S.C. 154(b) by 100 days.

(21) Appl. No.: 11/757,421

(22) Filed: Jun. 4, 2007

(65) Prior Publication Data

US 2007/0290756 A1   Dec. 20, 2007

Related U.S. Application Data

(60) Provisional application No. 60/803,881, filed on Jun. 5, 2006, provisional application No. 60/803,882, filed on Jun. 5, 2006, provisional application No. 60/803,884, filed on Jun. 5, 2006, provisional application No. 60/811,022, filed on Jun. 5, 2006.

(51) Int. Cl.
*H03G 3/30*   (2006.01)

(52) U.S. Cl. ..................... 330/279; 330/129

(58) Field of Classification Search ............. 330/129, 330/278, 279
See application file for complete search history.

(56) References Cited

U.S. PATENT DOCUMENTS

| | | | |
|---|---|---|---|
| 5,490,127 A | 2/1996 | Ohta et al. | |
| 5,559,785 A | 9/1996 | Honda et al. | |
| 6,115,334 A | 9/2000 | Tsutsui et al. | |
| 6,154,429 A | 11/2000 | Grimm | |
| 6,469,979 B1 | 10/2002 | Joo et al. | |
| 6,728,180 B1 | 4/2004 | Park | |
| 6,807,134 B2 | 10/2004 | Nakajima et al. | |
| 6,977,550 B2 * | 12/2005 | Ishida et al. | ............. 330/279 |
| 7,295,073 B2 * | 11/2007 | Hsieh et al. | ............. 330/279 |
| 2004/0172148 A1 | 9/2004 | Horibe | |
| 2005/0243681 A1 | 11/2005 | Yen | |

FOREIGN PATENT DOCUMENTS

| | | | |
|---|---|---|---|
| EP | 0831480 B1 | 8/2001 | |
| EP | 1251507 A2 | 10/2002 | |

* cited by examiner

*Primary Examiner*—Khanh V Nguyen
(74) *Attorney, Agent, or Firm*—Thomas, Kayden, Horstemeyer & Risley

(57) ABSTRACT

An electrical device and a loop control method are provided. A data signal is obtained from a front end. A variable gain amplifier amplifies the data signal based on a gain value. An analog to digital converter samples the amplified data signal output therefrom to generate a digital data signal. A peak bottom detector detects a peak level and a bottom level of the digital data signal. A threshold controller compares the peak and bottom levels with a threshold value, and generates a first control signal accordingly. An auto gain controller updates the gain value based on the peak and bottom levels with a first step size. The first step size is determined by the first control signal.

42 Claims, 28 Drawing Sheets

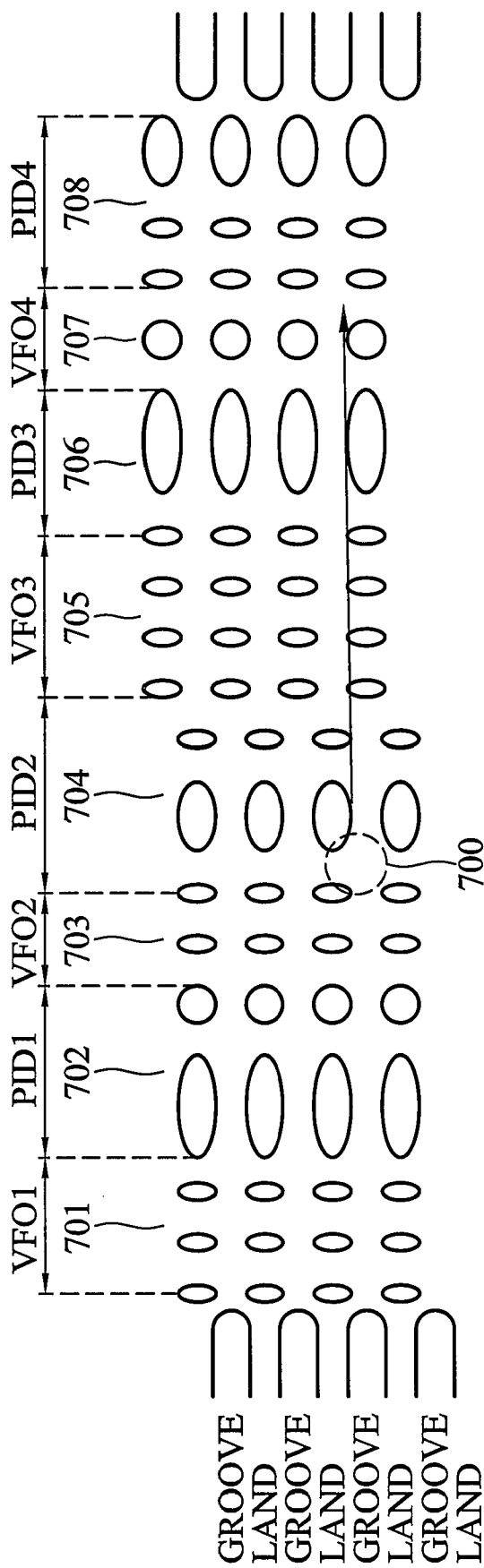
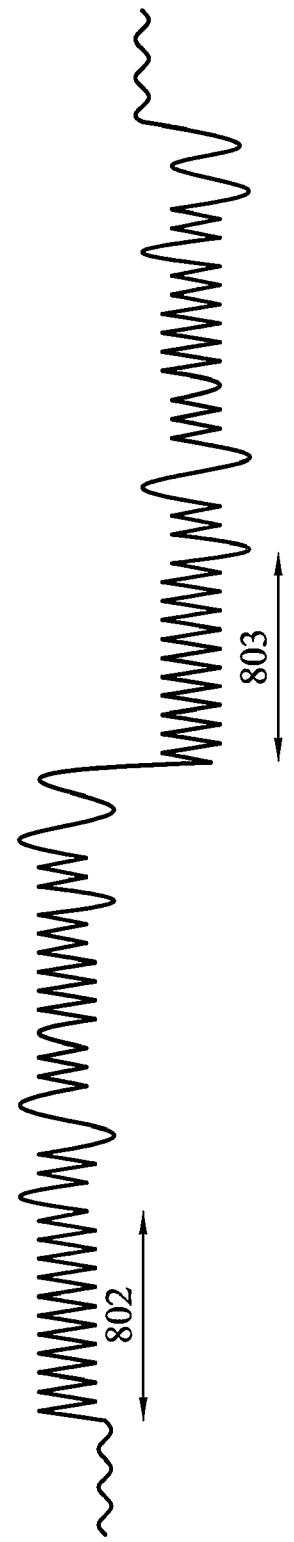
FIG. 7 (PRIOR ART)
FIG. 8 (PRIOR ART)

LOOP CONTROL APPARATUS AND METHOD THEREOF

CROSS REFERENCE TO RELATED APPLICATIONS

This application claims the benefit of U.S. Provisional Application No. 60/803,881, 60/803,884, 60/811,022 and 60/803,882 filed Jun. 05, 2006.

BACKGROUND OF THE INVENTION

1. Field of the Invention

The invention relates to electrical devices, and in particular, to method and circuit for loop control.

2. Description of the Related Art

FIG. 1A shows a conventional optical storage device. Conventionally, data stored in an optical disc is amplified and digitized to a target level before decoding. The variable gain amplifier 102, analog to digital converter 104 and auto gain controller 106 form an AGC loop to adjust the gain of the RF signal #RF. An extra data path is formed by a blank detection unit 110 to detect blankness of the RF signal #RF, where the blankness is corresponding to at least a blank sector of a track on the optical disc. If amplitude of the RF signal #RF is below a predetermined threshold, the decoder 108 is not enabled to decode data, and the corresponding sector is reported as blank. Otherwise, if the RF signal #RF is not blank, the blank detection unit 110 sends an enable signal #en to the decoder 108, enabling the decoder 108 to decode the data signal #DATA output from analog to digital converter 104.

FIG. 1B is a schematic view showing the situation of blankness. When the amplitude of the RF signal #RF is below the threshold (+th and −th), the corresponding sector where the RF signal #RF is obtained is reported as a blank sector. When the amplitude of RF signal #RF exceeds the threshold, the decoder is enabled to decode the data signal #DATA.

FIG. 2 shows a conventional loop control circuit for implementation to an electrical device, such as an optical storage device. The loop control circuit typically comprises an auto gain control loop formed by variable gain amplifier 202, analog to digital converter 204, peak bottom detector 206 and auto gain controller 208, and an offset control loop formed by variable gain amplifier 202, analog to digital converter 204, offset controller 210 and adder 212. The variable gain amplifier 202 amplifies an RF signal #RF received from a front end, such as an optical disc (not shown) before transmission to the analog to digital converter 204. The RF signal includes data information therein. If the amplitude of RF signal #RF is not within a proper range, the analog to digital converter 204 may not correctly sample the RF signal #RF to generate the digital data signal #DATA. Thus, the auto gain controller 208 generates a gain value #gain to control the amplification of RF signal #RF, and the gain value #gain is determined by detection results of the peak bottom detector 206. The auto gain controller 208 utilizes a step size to update the gain value #gain according to peak and bottom levels #PB sent from the peak bottom detector 206, and the gain control loop is recursively processed to gradually approximate the amplitude of data signal #DATA to a target level. Therefore the step size may also be referred to as a loop convergence ratio. Likewise, the offset controller 210 detects offset of the data signal #DATA and generates an offset signal #offset to compensate RF signal #RF. The RF signal #RF may be directly added by the offset signal #offset in the adder 212 before transmission to the variable gain amplifier 202, and the offset signal #offset is recursively and gradually updated by another step size provided in the offset controller 210. In this way, the offset of RF signal #RF is gradually corrected through the feedback mechanism.

FIG. 3 shows waveforms of various conditions. The RF signal #RF obtained from the front end may not be at a proper level for post processing. For example, in period t1, the amplitude of RF signal #RF is below the target level (+target and −target), and the gain control loop gradually amplifies the RF signal #RF to approximate the target level. In period t2, the amplitude of RF signal #RF exceeds the target level, and the gain control loop works to reduce it. Periods t3 and t4 show examples of offset compensation. The offset control loop as described in FIG. 2 gradually adjusts the RF signal #RF through feedback control, thus the RF signal #RF is maintained within the target level before transmission to the analog to digital converter 204. Time required for the control loops to approximate the RF signal #RF to the target level, however, may be inefficient. If the convergence ratio of the control loops is set too low, a long period of time is required before the RF signal #RF reaches the target level. Otherwise, if the convergence ratio is set too high, the control loops may be unstable, reducing signal quality for the analog to digital converter 204. Thus, determination for step sizes of the gain control loop and offset control loop is an important issue.

Please refer to FIG. 4. FIG. 4 is a cross-sectional diagram illustrating an optical medium. As shown in FIG. 4, the innermost area is the inner drive area, then the lead-in zone, the data zone, lead-out zone, and the outer drive area. The inner drive area includes different sub-zones such as the initial zone, the inner disc test zone, the count zone run-in, the inner disc count zone, the inner disc administration zone, and the table of contents zone. The inner disc test zone is disposed for the optical storage drive to perform disc tests and Optimized Power Control (OPC) algorithms. The optical storage drive emits laser beams with various power levels onto the inner disc test zone of an optical storage medium to form a plurality of marks. Then, the reproduction signals from those marks are captured as reference information for adjusting emitted power level. Thus, the optical storage drive can optimize the power level of the emitted laser beams.

The optimized power is determined according to the asymmetry of the waveform of the recorded data reproduction signals. In the prior art, the asymmetry of the waveform of the recorded data reproduction signal is measured in analog domain, costing much layout space and raising the design complexity.

Signal quality can deteriorate significantly with servo error such as tilt and mis-track of a disc as recording density becomes higher not only in a disc only for reproduction such as a DVD-ROM but also in a recordable disc such as a DVD-RAM. In particular, in the recordable disc, the recording quality deteriorates due to the influence of the servo error when the servo error occurs during recording and the deterioration of the quality of the signal becomes severe due to the servo error during the reproduction of an applicable part.

In a DVD-RAM disc, information is recorded on a track comprising a land track and a groove track. The land track and the groove track alternate when the disc rotates one circle (360 degrees). The land track and the groove track are alternated in the DVD-RAM disc to provide a tracking guide in an initial stage and reduce crosstalk between adjacent tracks in high density narrow tracks.

Each track comprises sectors having a uniform length. A pre-embossed header area is provided during the manufacturing of the disc as a means of physically dividing the sectors. The physical addresses of the sectors are recorded in the pre-embossed header area. Each sector comprises a data area and a header area in which physical identification data (PID) is recorded.

FIG. 5A shows the physical shape of the land track in a DVD-RAM disc. FIG. 5B shows the waveform of a Read channel 1 signal in the land track. The header area is repeatedly arranged in every sector of the track. Four PIDs (PID1 through PID4) having the same value are recorded in one header area. The PID1 and the PID2 are arranged to deviate from the center of the track by a certain amount and the PID3 and the PID4 are arranged to deviate from the center of the track in a direction opposite to that of the PID1 and PID2 so that the PIDs can be correctly read even if a laser spot 500 deviates from the center of the track. The Read channel 1 signal shown in FIG. 5B can be obtained in the land track, wherein ISHD1, ISHD2, ISHD3, and ISHD4 are respectively DC bottom values of variable-frequency oscillator (VFO) signals of fields Header 1, Header 2, Header3, and Header4. Also, the arrangements of the PID1 and PID2 and the PID3 and PID4 in the land track are opposite to those in the groove track. FIG. 6A shows the physical shape of the groove track in a DVD-RAM disc. FIG. 6B shows the waveform of the Read channel 1 signal in the groove track.

FIG. 7 shows the enlarged header area shown in FIGS. 5A and 5B. In the structure of the header area, the PID1 and PID2, and the PID3 and PID4 are arranged to deviate from the center of the track in opposite directions by a uniform amount. The VFO signal having a specified frequency for synchronizing and detecting ID and an ID signal showing the physical addresses of the sectors are recorded in the respective PIDs. The VFO signal has a recording pattern of 4 T (T is a period of the clock signal). As shown in FIG. 7, the header area comprises VFO1 area 701 and PID1 702, VFO2 area 703 and PID2 704, VFO3 area 705 and PID3 706, and VFO4 area 707 and PID4 708. In FIG. 7, when the laser spot 700 passes through the header area of the groove track, a Read channel 1 signal #RF shown in FIG. 8 is obtained. In FIG. 8, a VFO1 signal 802 corresponds to VFO1 area 701 of FIG. 7. A VFO3 signal 803 corresponds to VFO3 area 705.

FIG. 9 shows a conventional apparatus detecting track center error and tilt error of a DVD-RAM disc. Peak detection circuit 901 detects peak values of Read channel 1 signal #RF and generates peak signals, and bottom detection circuit 902 detects bottom values of Read channel 1 signal #RF and generates bottom signals. Sample hold circuits 903A and 903B respectively sample the peak and bottom signals in areas VFO1 and VFO3, and hold the sampled signal until as being sampled by analog to digital converters (ADC) 905A and 905B which are low sampling rate ADCs. Track center error detector 907 calculates track center error with peak and bottom values sampled by ADCs 905A and 905B. Tilt error detector 909 calculates tilt error with bottom values sampled by ADCs 905B.

However, sample hold circuits 903A and 903B are analog circuitries, which have poorer accuracy opposite to digital circuitry. In addition, the sample times of sample hold circuits 903A and 903B are limited by their switching frequency. Thus, it is difficult to detect Read channel 1 signal #RF more frequently in a short period of time using the analog sample hold circuits 903A and 903B, deteriorating the detection accuracy. To detect Read channel 1 signal #RF more frequently in a short period of time, more complexity sample hold circuits are required, however, increasing the cost and size of the circuit detecting track center error and tilt error of a DVD-RAM disc.

BRIEF SUMMARY OF THE INVENTION

An optical storage device and a loop control method are provided. An RF signal is obtained from an optical disc. A variable gain amplifier amplifies the RF signal based on a gain value. An analog to digital converter samples the amplified RF signal output therefrom to generate a data signal. A peak bottom detector detects a peak level and a bottom level of the data signal. A threshold controller compares the peak and bottom levels with a threshold value, and generates a first control signal accordingly. An auto gain controller updates the gain value based on the peak and bottom levels with a first step size. The first step size is determined by the first control signal.

The threshold controller comprises an upper comparator, comparing the peak level with a positive high threshold, and a lower comparator comparing the bottom level with a negative high threshold. If the peak level exceeds the positive high threshold, the upper comparator outputs a true value, and otherwise a false value. If the bottom level is more negative than the negative high threshold, the lower comparator outputs a true value, otherwise a false value. If both upper comparator and lower comparator output true values, a first mode controller outputs the first control signal to the auto gain controller. The first mode controller may be an AND gate. If the first control signal is a true value, the auto gain controller increases the first step size to accelerate the gain control loop formed by the variable gain amplifier, analog to digital converter and auto gain controller.

The optical storage device may further comprise an offset controller, generating an offset signal based on the data signal to cancel offset of the RF signal, and an adder updating the RF signal by the offset signal before transmission to the variable gain amplifier. The threshold controller generates a second control signal based on comparison results of the peak and bottom levels versus the threshold value, and the offset signal is updated with a second step size determined by the second control signal. If the peak level exceeds the positive high threshold, the upper comparator outputs a true value, otherwise a false value. If the bottom level is more negative than the negative high threshold, the lower comparator outputs a true value, otherwise a false value. If one of the upper comparator and lower comparator outputs a true value, a second mode controller outputs the second control signal to the offset controller. The second mode controller may be a XOR gate. If the first control signal is a true value, the offset controller increases the second step size to accelerate the offset control loop formed by the variable gain amplifier, analog to digital converter, offset controller and adder.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 7 shows the enlarged header area shown in FIGS. 5A and 6A;

FIG. 8 shows a Read channel 1 signal obtained when the laser spot passes through the header area of the groove track;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
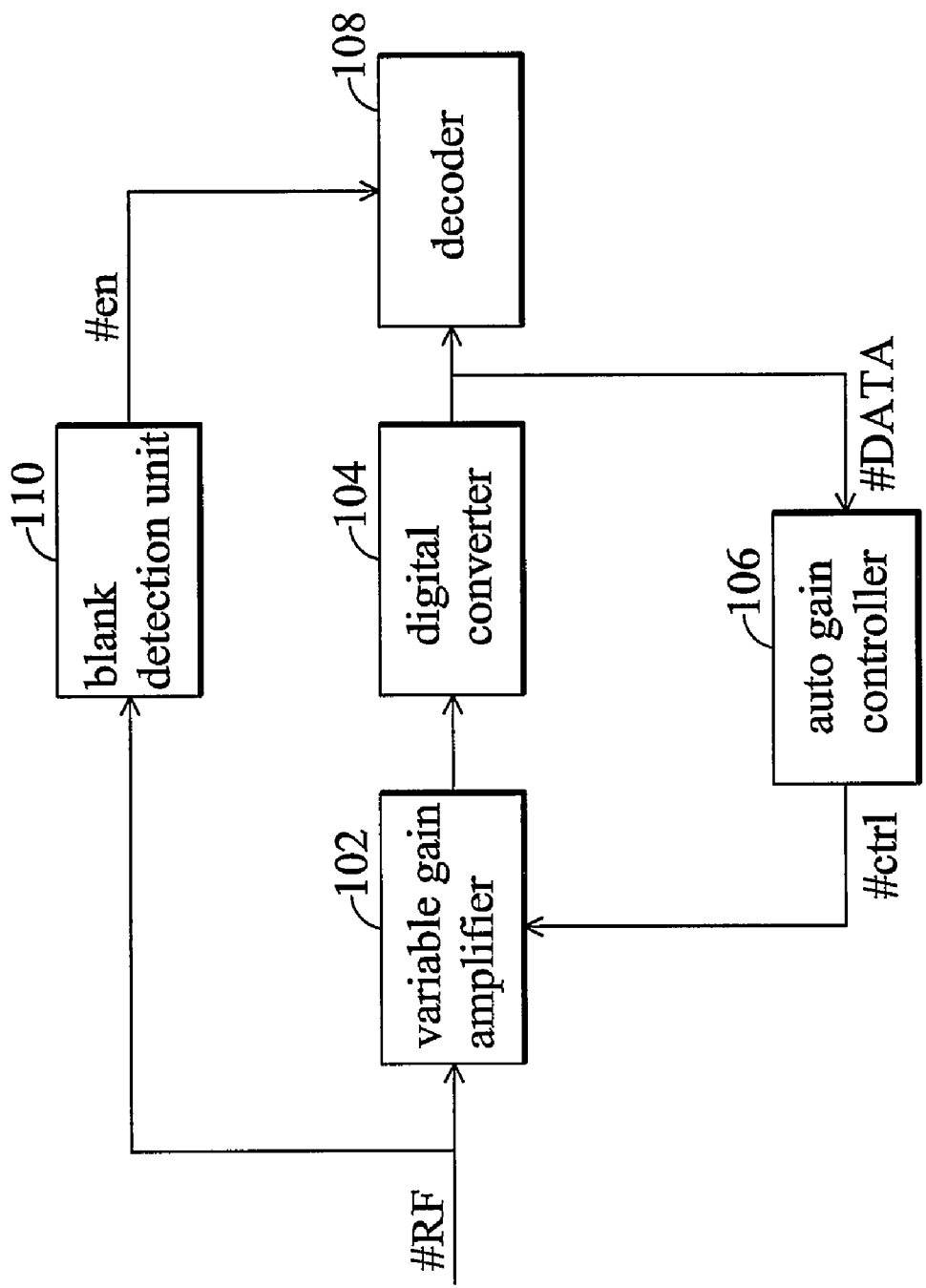
FIG. 1A shows a conventional optical storage device.
Figure 1B:
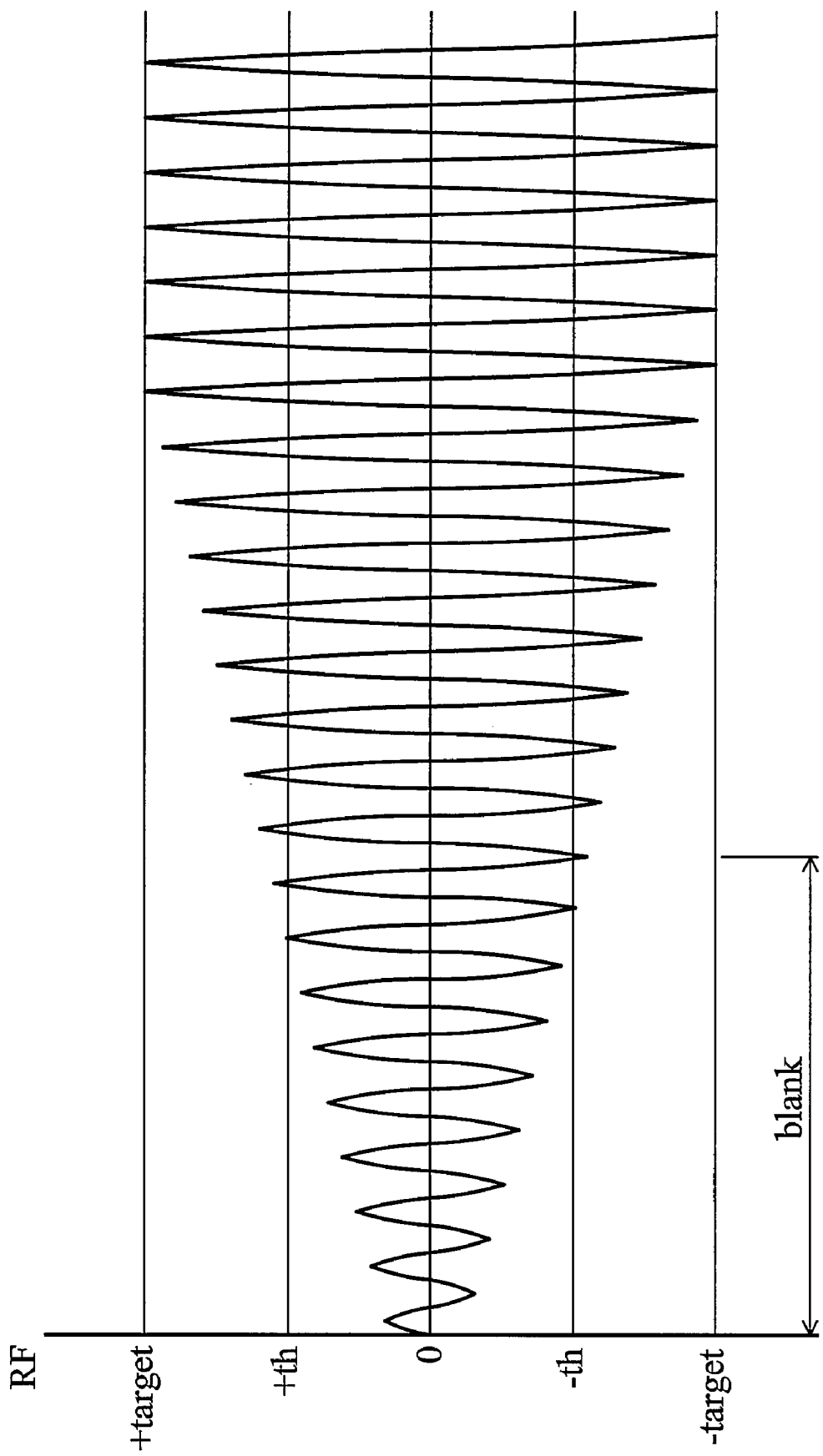
FIG. 1B is a schematic view showing the definition of blankness.
Figure 2:
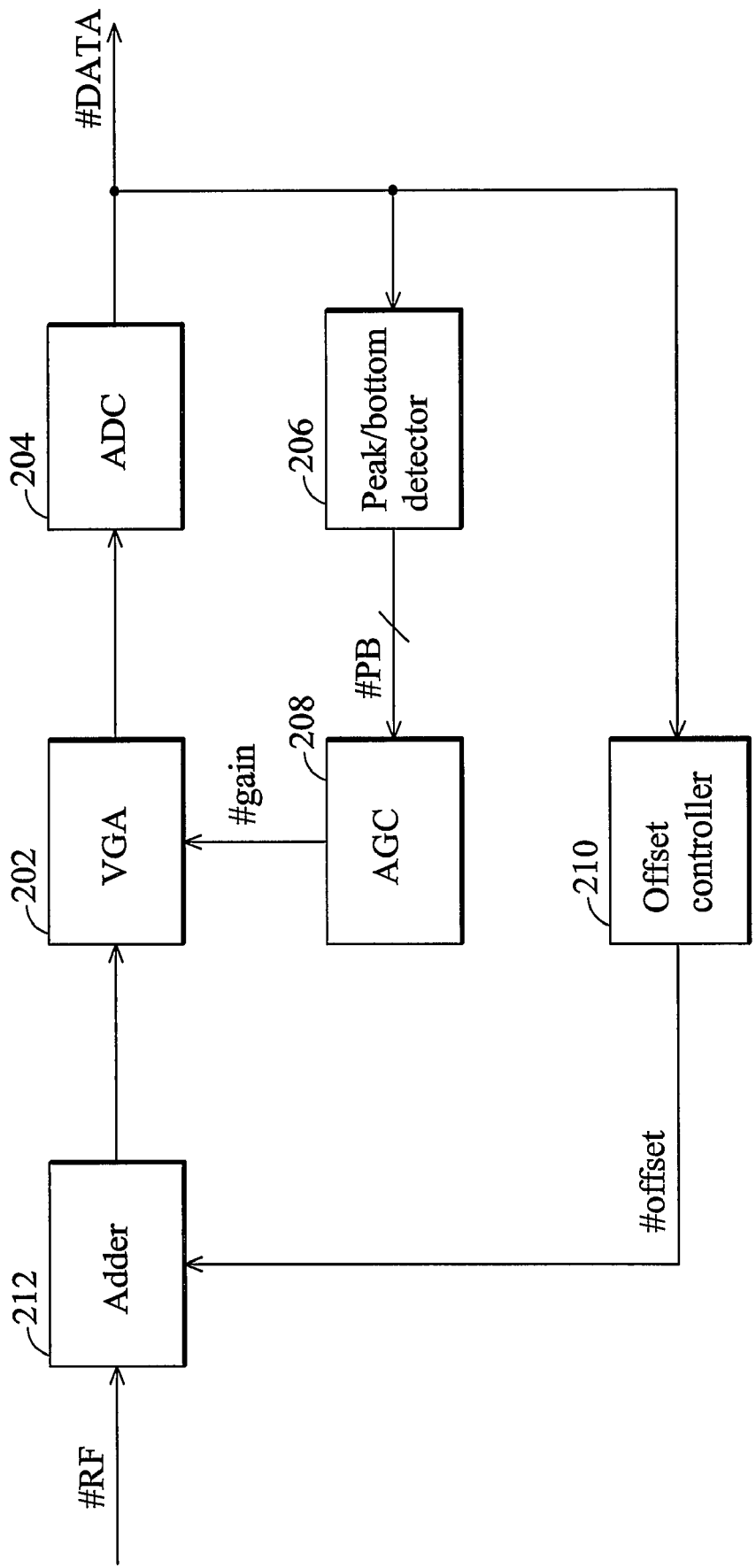
FIG. 2 shows a conventional loop control circuit for an optical storage device.
Figure 10:
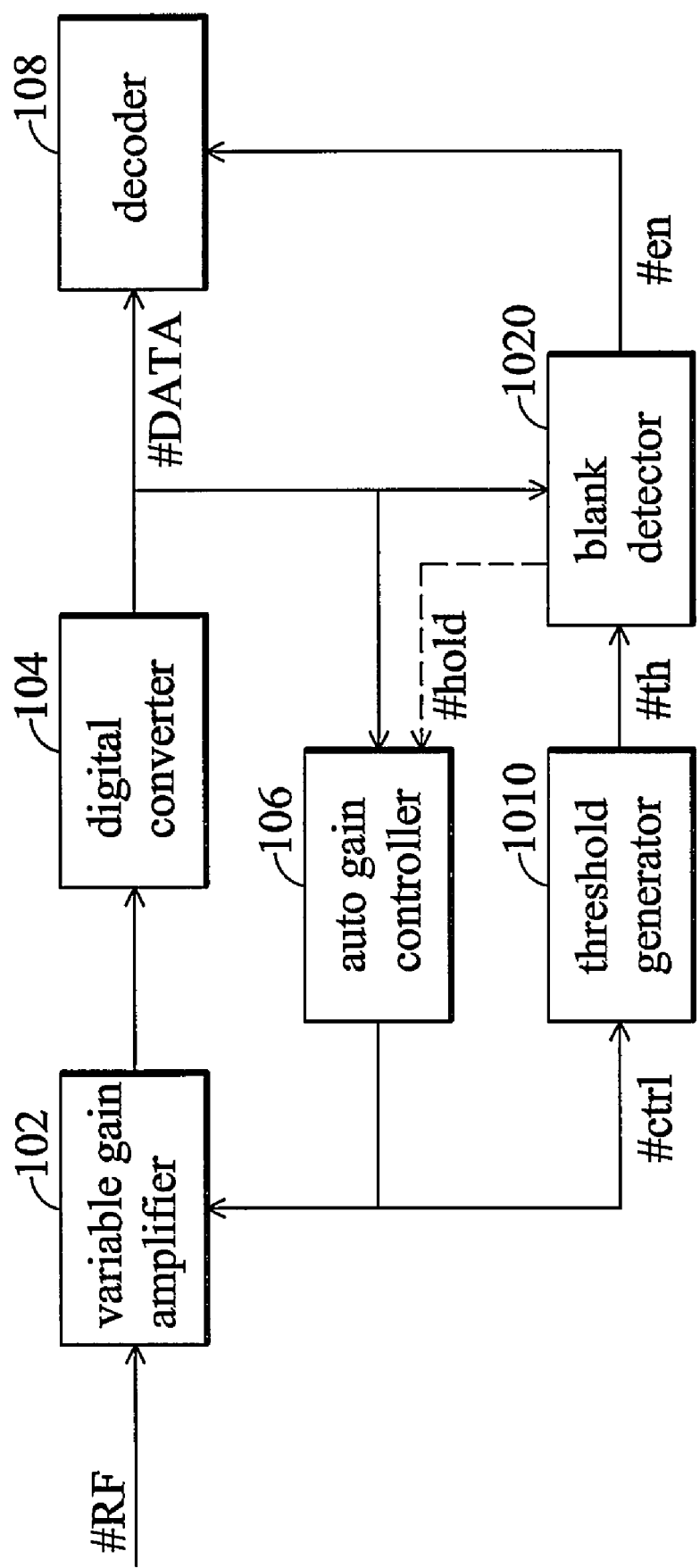
FIG. 10 shows an embodiment of an optical storage device.

FIG. 10 shows an embodiment of an optical storage device. In the embodiment, a different structure is provided. A blank detector 1020 uses data signal #DATA output from the analog to digital converter for blank detection, reducing the cost of implementing the circuit path of the blank detection unit 110 in FIG. 1A. The blank detector 1020 is implemented as a digital circuit, the cost of which is lower than analog circuits. In FIG. 1A, the data signal #DATA output from the analog to digital converter 104 is sent to auto gain controller 106, and the auto gain controller 106 generates a control signal #ctrl to the variable gain amplifier 102 to adjust the gain value for amplifying the RF signal #RF, thus an AGC loop is formed thereby to gradually approximate the amplitude of the data signal #DATA to a target level. Since amplitude of the data signal #DATA varies, the blank detector 1020 may obtain a false blank detection result. To ensure more accurate detection, the threshold generator 1010 provides a dynamic threshold #th proportional to the control signal #ctrl. Thus, when the data signal #DATA is amplified, the threshold #th is amplified identically, enabling the blank detector 1020 to detect blankness regardless of whether the variable gain amplifier 102 amplifies the RF signal #RF.

If blank for a period of time, the AGC loop may gradually amplify the RF signal #RF to reach the target level, causing unwanted loop divergence. The blank detector 1020 may provide an optional function for solving this problem. If the amplitude of the data signal #DATA does not exceed the threshold #th, which means the RF signal #RF is blank, the blank detector 1020 sends a hold signal #hold to the auto gain controller 106 to suspend update of the control signal #ctrl. Thus, the gain value of a blank RF signal #RF is kept constant. Simultaneously, blank detection continues with the threshold #th calculated from the control signal #ctrl while the auto gain controller 106 is suspended. When the data signal #DATA is determined to be non-blank, the auto gain controller 106 is again activated to enable the AGC loop.

Figure 11A:
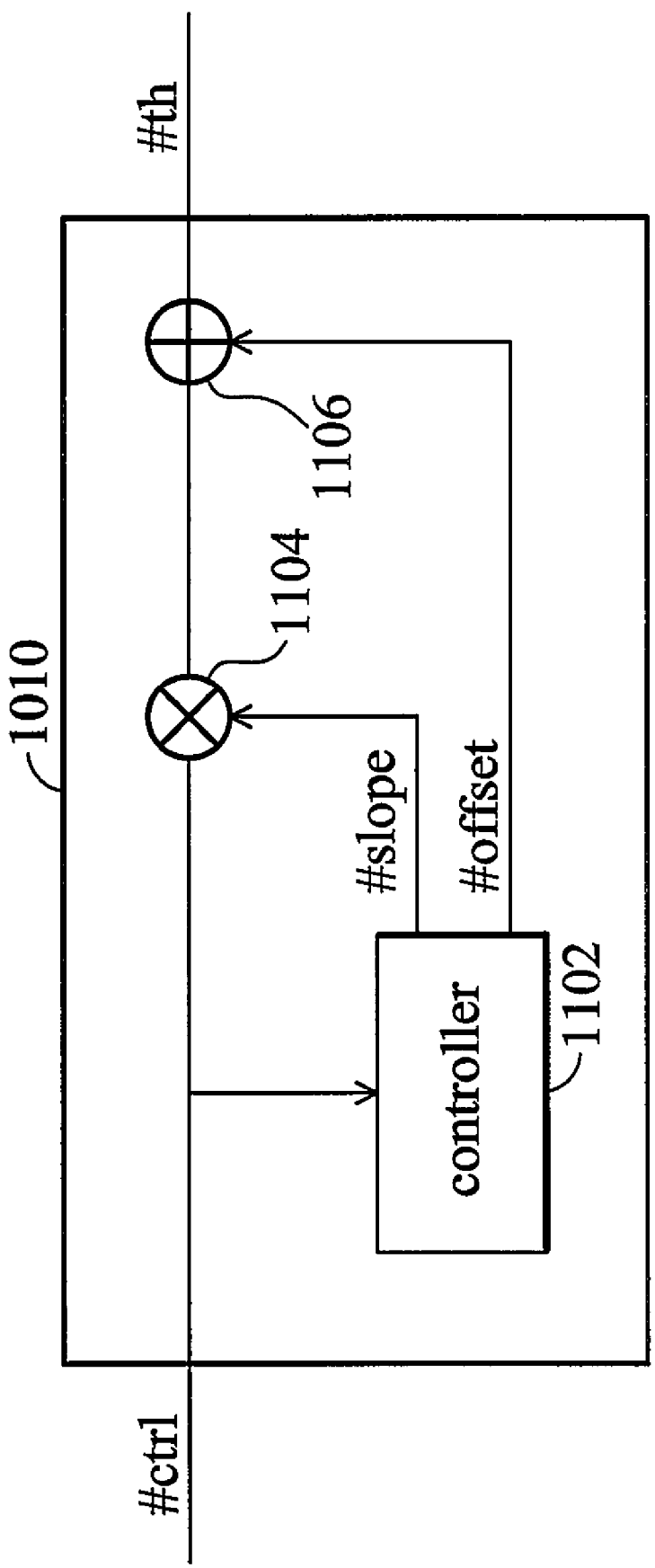
FIG. 11A shows an embodiment of the threshold generator according to FIG. 10.
Figure 11B:
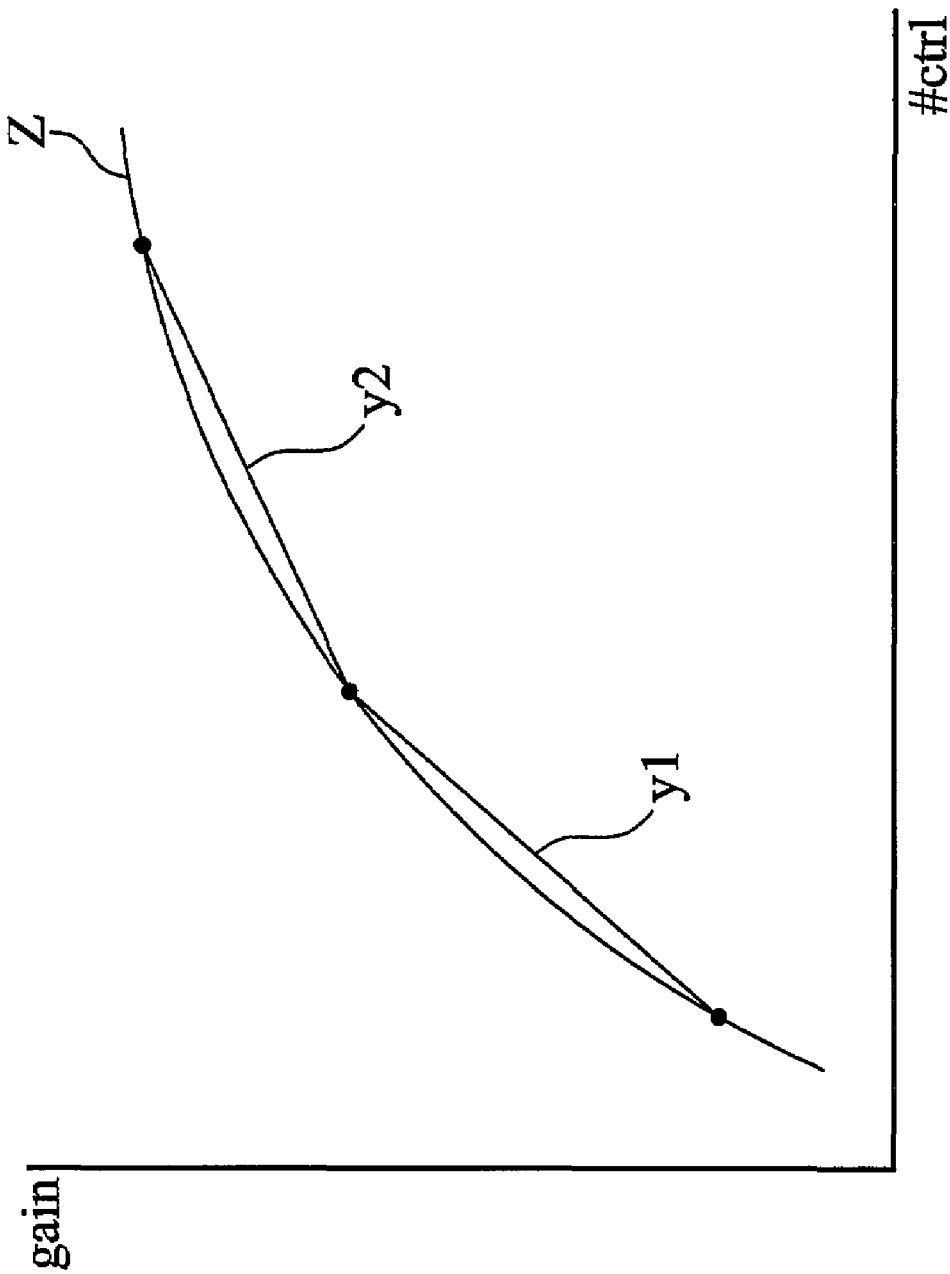
FIG. 11B is a transition chart of gain versus control signal.

FIG. 11A shows an embodiment of the threshold generator 1010 according to FIG. 10, and FIG. 11B is a transition chart of gain versus the control signal #ctrl. The threshold #th is proportional to the control signal #ctrl as well as the gain value in the variable gain amplifier 102. To simplify the implementation, the threshold generator 1010 may be a digital circuit converting the control signal #ctrl with an approximated linear relationship. In FIG. 11B, the curve z indicates gain value generated by the variable gain amplifier 102 corresponding to the control signal #ctrl. The lines y1 and y2 are utilized to approximate the curve z, and the threshold #th is generated accordingly. The threshold generator 1010 comprises an adder 1106, a controller 1102 and a multiplier 1104. The lines $y_1$ or $y_2$ can be denoted as a linear function:

$$y_n = a_n x + b_n$$

Where n is an integer, $a_n$ is the slope of the line and $b_n$ is the offset.

In FIG. 11A, the controller 1102 receives the control signal #ctrl to generate a slope value #slope and an offset value #offset. The values of the slope value #slope and offset value #offset are generated in response to the control signal #ctrl. The multiplier 1104 then multiplies the control signal #ctrl with the slope value #slope, and the adder 1106 adds the output of multiplier 1104 with the offset value #offset to generate the threshold #th. The value of the control signal #ctrl can be categorized into several ranges, each corresponding to a line with specific slope an and offset $b_n$. For example, FIG. 11B is an example of n equal to 2, thus two lines are presented to approximate the curve z. When the amplitude of the control signal #ctrl is in a first range, the controller 1102 generates the slope value #slope $a_1$ and offset value #offset $b_1$. When the amplitude of the control signal #ctrl is in a second range, the controller 1102 generates the slope value #slope $a_2$ and the offset value #offset $b_2$. The value n is not limited to be 2, and can be increased to provide more accurate approximation, and can be decreased to provide for easier implementation. Alternatively, the threshold generator 1010 can be a digital lookup table directly mapping the control signal #ctrl to the threshold #th. The characteristic curve z is often obtained by conventional calibration processes, thus the threshold generator 1010 can be configured at the calibration stage as well.

Figure 12:
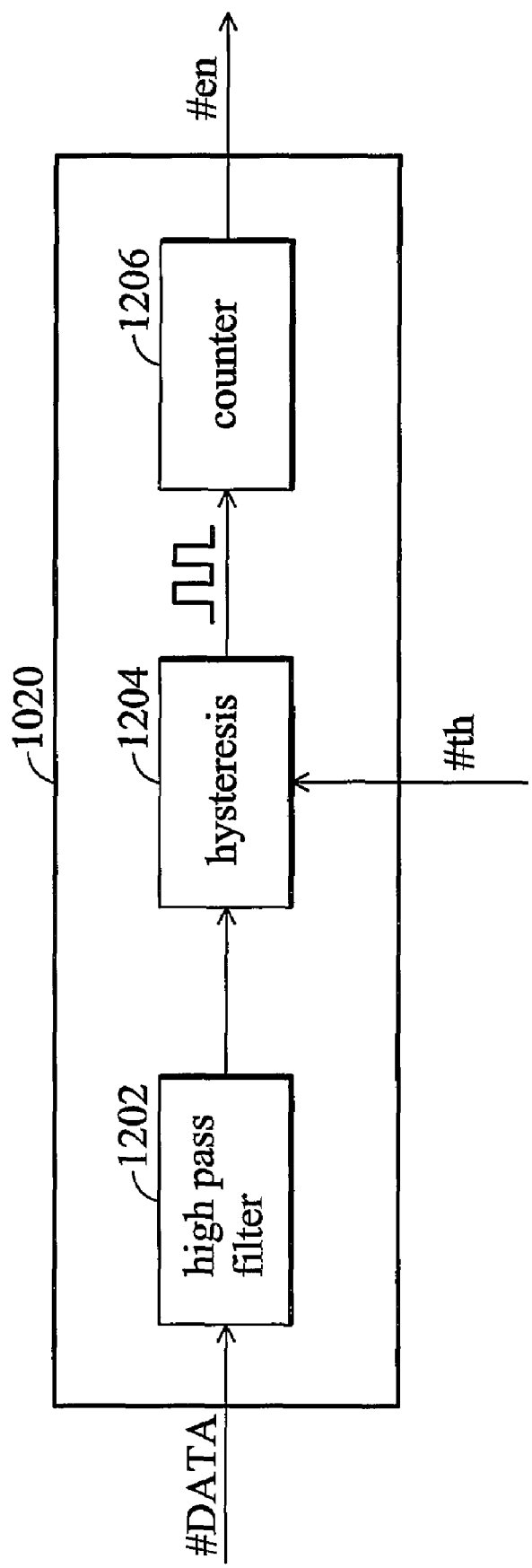
FIG. 12 shows an embodiment of a blank detector according to FIG. 10.

FIG. 12 shows an embodiment of a blank detector 1020 according to FIG. 10. The blank detector 1020 comprises three digital components, a high pass filter 1202, a hysteresis 1204 and a counter 1206. The high pass filter 1202 receives the data signal #DATA to filter out low frequency components. The hysteresis 1204 is coupled to the high pass filter 1202, slicing the data signal #DATA into a binary wave signal to represent value 0 or 1 with varying duty cycles. The value 0 of the binary wave signal represents corresponding blank sector, and the value 1 of the binary wave signal represents corresponding non-blank sector. The counter 1206 counts the duty cycle of the binary wave signal to determine blankness of the RF signal #RF. The threshold #th can be sent to the hysteresis 1204 for adjusting the slice level of the hysteresis 1204 to generate the binary wave signal from the data signal #DATA. Alternatively, the threshold #th also can be sent to the counter 1206 to decide a counting number of the binary wave signal. For example, if the threshold #th controls sensitivity of the hysteresis 1204, the filtered data signal #DATA from high pass filter 1202 will not generate a binary wave signal with value 1 if it's magnitude is lower than a value corresponding to the threshold #th, and the counter 1206 determines the RF signal #RF as blank since no (or few) binary wave signal with value 1 is counted. When the counter 1206 detects non-zero binary wave signal, an enable signal #en is sent to enable the decoder 108, and the decoder 108 is enabled to decode the data signal #DATA.

Figure 13:
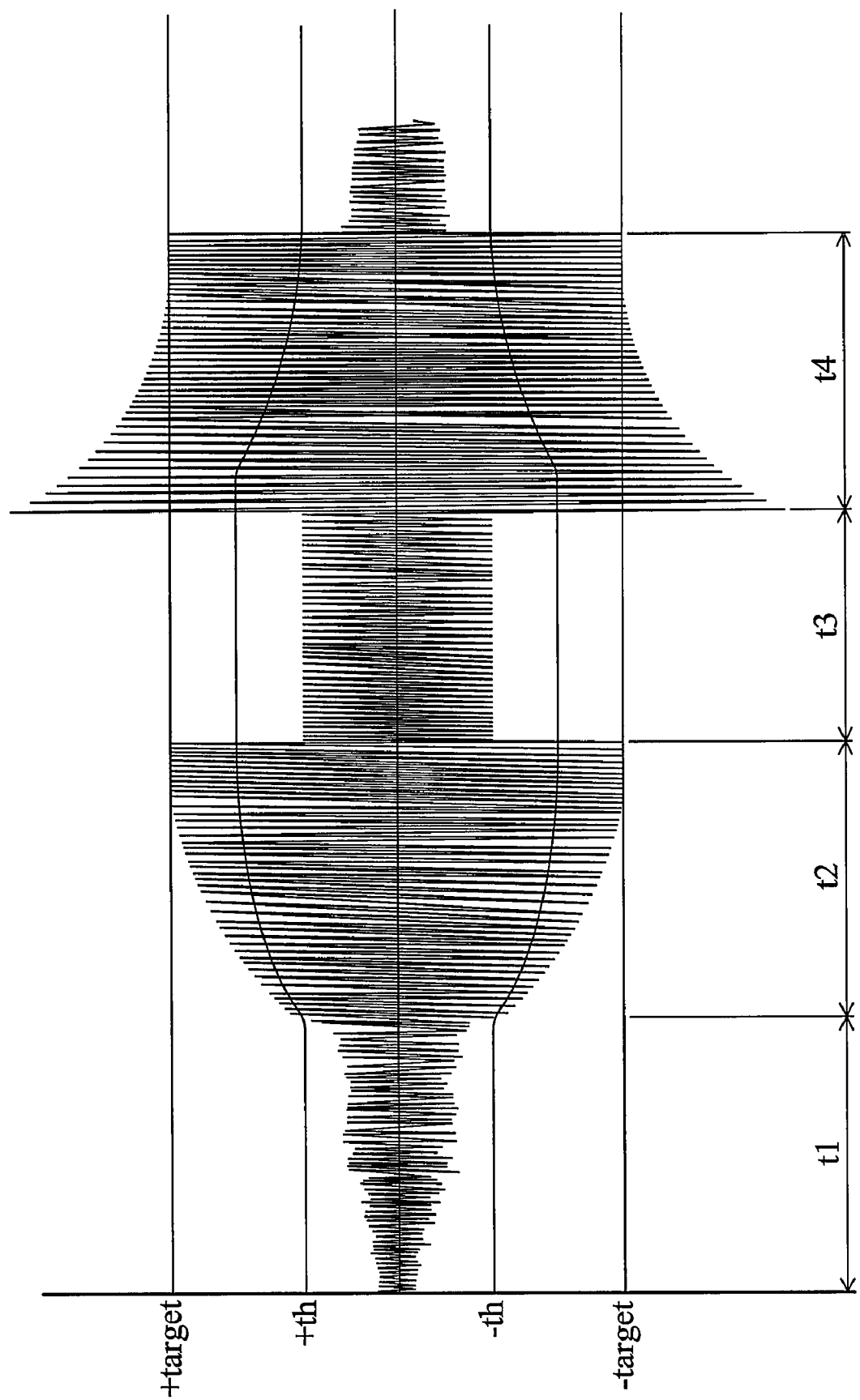
FIG. 13 shows an example of waveform transition according to the embodiment.

FIG. 13 shows an example of waveform transition according to the embodiment. In period t1, the amplitude of data signal #DATA does not exceed the threshold #th, so the RF signal #RF is reported as blank, and the threshold #th remain constant because the auto gain controller 106 is suspended by the hold signal #hold. In period t2, the amplitude of data signal #DATA exceeds the threshold #th, so the AGC loop is activated to gradually amplify the data signal #DATA to the target value (+−target). Simultaneously, the threshold #th is increased in proportion to the amplification of the data signal #DATA. In period t3, the amplitude of data signal #DATA falls below the threshold #th, which means another blank section is read. Note that the threshold #th in period t3 is higher than that in period t1. If the threshold #th is not dynamically adjusted, the data signal #DATA in period t3 may be deemed non-blank because its amplitude is higher than the threshold #th in period t1. Since blank is detected in period t3, the AGC loop is suspended again, so the threshold #th remains constant as well as the gain in the variable gain amplifier 102. In period t4, a data signal #DATA of exceedingly high amplitude may be received, and the AGC loop is activated to reduce its amplitude to the target level. Simultaneously, the threshold #th is reduced proportionally. This embodiment shows a dynamically adjusted threshold #th that avoids false blank detection.

Figure 14:
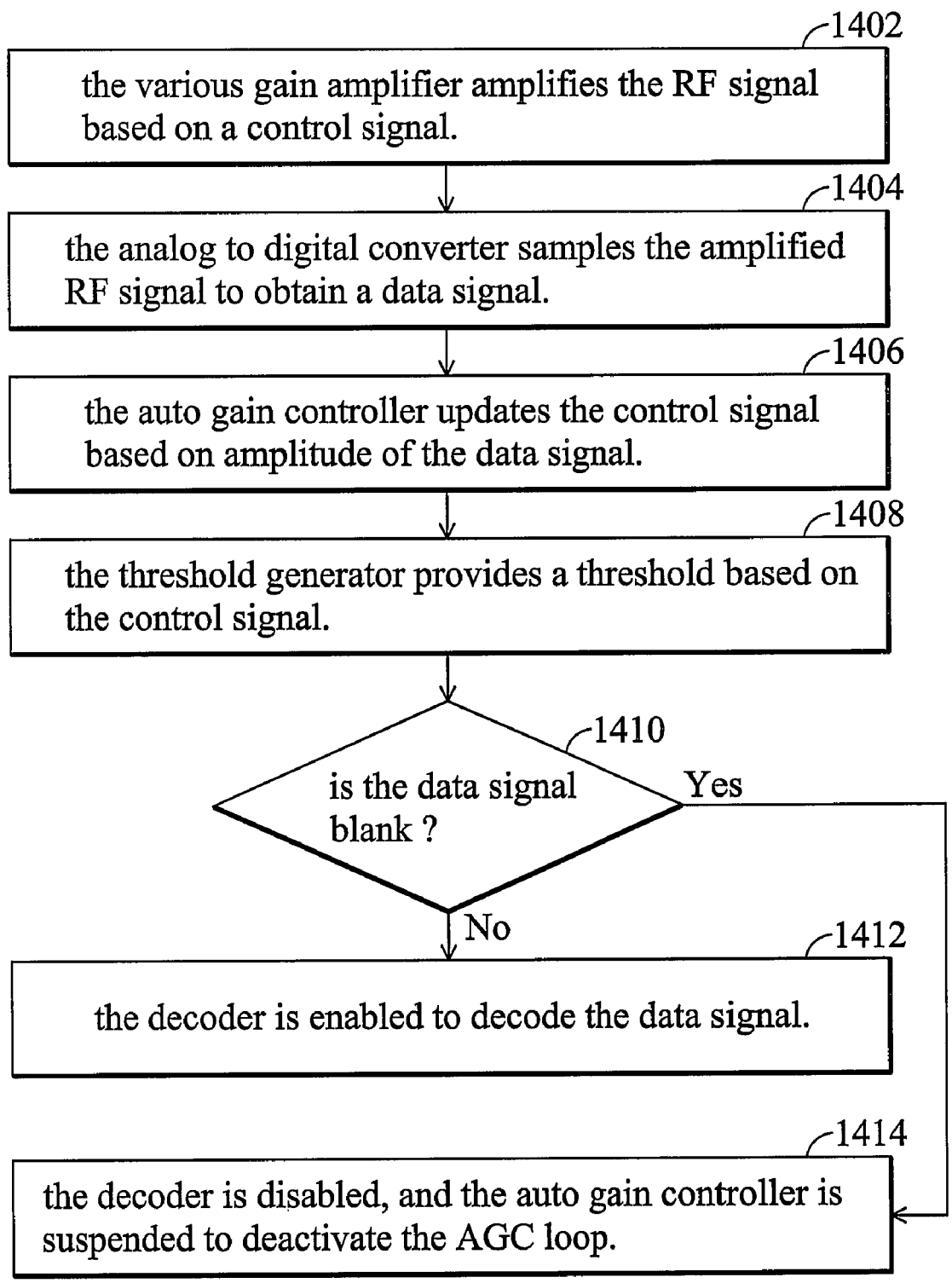
FIG. 14 is a flowchart of the blankness detection method.

FIG. 14 is a flowchart of the blankness detection method. In step 1402, the variable gain amplifier 102 amplifies the RF signal #RF based on a control signal #ctrl. In step 1404, the analog to digital converter samples the amplified RF signal #RF to obtain a data signal #DATA. In step 1406, the auto gain controller 106 updates the control signal #ctrl based on amplitude of the data signal #DATA. In step 1408, the threshold generator 1010 provides a threshold #th based on the control signal #ctrl. In step 1410, the blank detector 1020 detects blankness of the data signal #DATA based on the threshold #th. In step 1412, if the data signal #DATA is not blank, the decoder 108 is enabled to decode the data signal #DATA. In step 1414, if blankness is detected, the blank detector 1020 disables the decoder 108, and suspends the auto gain controller 106 to deactivate the AGC loop.

Figure 15:
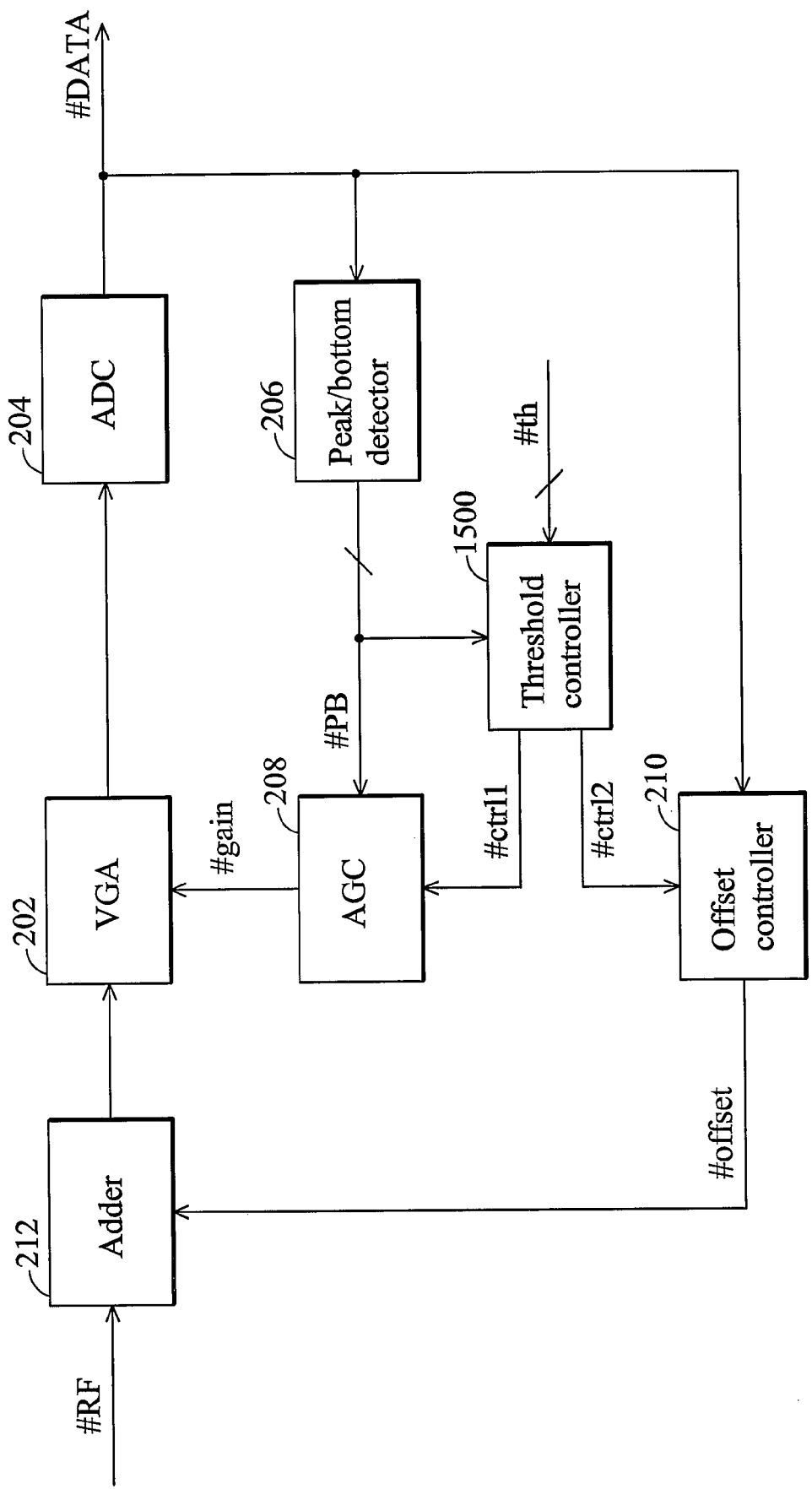
FIG. 15 shows an embodiment of a loop control circuit.

FIG. 15 shows an embodiment of a loop control circuit. A auto gain control loop is formed by the variable gain amplifier 202, analog to digital converter 204, peak bottom detector 206 and the auto gain controller 208 for gain control of the data signal #DATA. A threshold controller 1500 is added to provide threshold determination. Step sizes of the auto gain controller 208 and offset controller 210 are dynamically adjustable. In this way, the variable gain amplifier 202 amplifies the RF signal based on a gain value #gain, and the analog to digital converter 204 samples the amplified RF signal output therefrom to generate a data signal #DATA. Thereafter, peak and bottom levels of the data signal #DATA are detected by the peak bottom detector 206. In the threshold controller 1500, it is utilized to determine whether the peak level exceeds a positive high threshold +Hth and the bottom level lower than a negative high threshold −Hth. The positive high threshold +Hth may be a value higher than the target level (+target), or identical to the target level. Likewise, the negative high threshold −Hth is a negative value corresponding to the negative target level (−target) for bottom level detection. If the RF signal #RF is over-amplified by the variable gain amplifier 202, the peak level will exceed the positive high threshold +Hth, and the bottom level will be lower than the negative high threshold −Hth. In this case, the threshold controller 1500 sends a first control signal #ctrl1 to the auto gain controller 208 to increase its step size, converging the gain control loop to the target level faster. The gain value #gain is then updated based on the peak and bottom levels with the adjusted step size.

Figure 3:
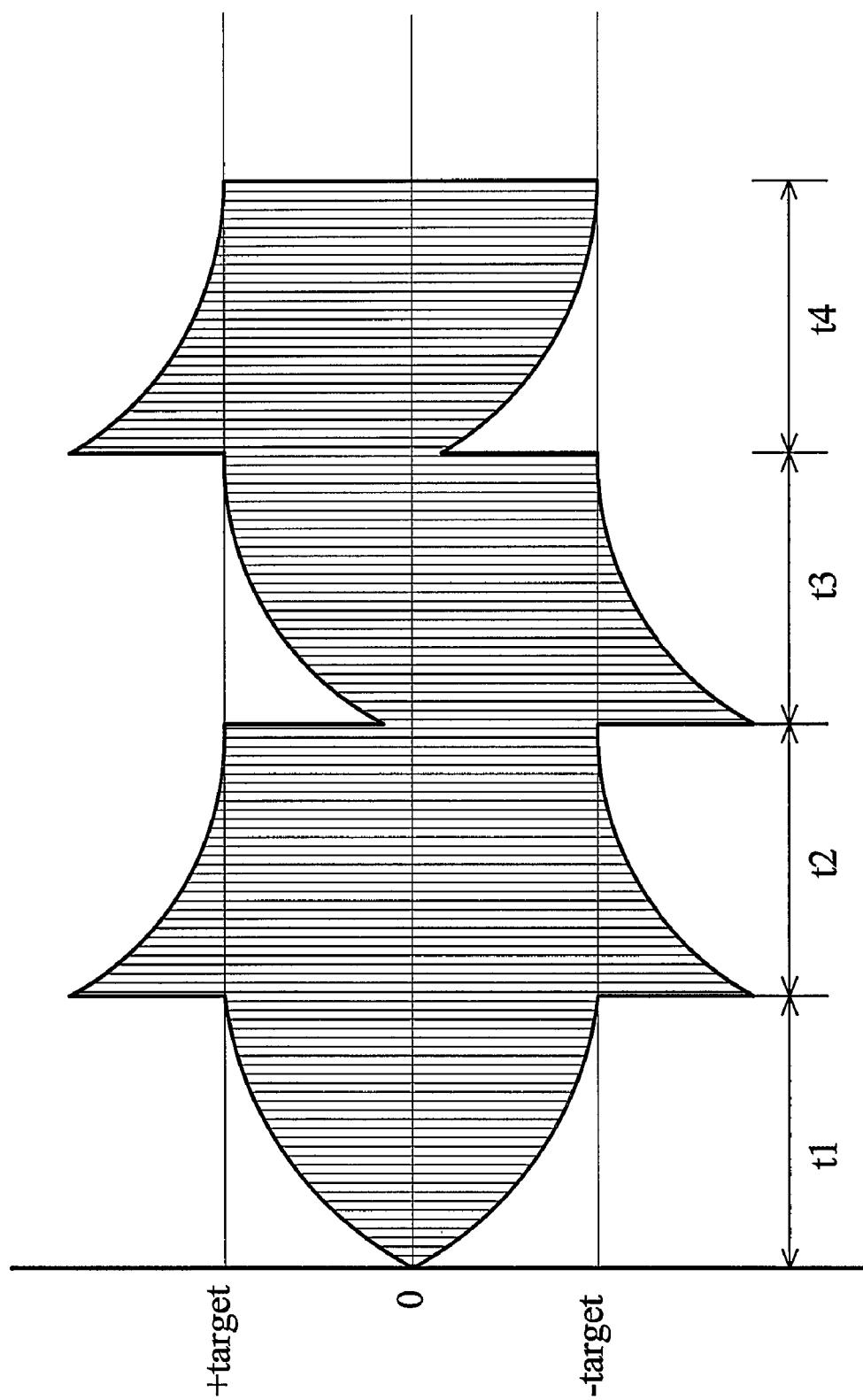
FIG. 3 shows a waveform of various conditions.
Figure 4:
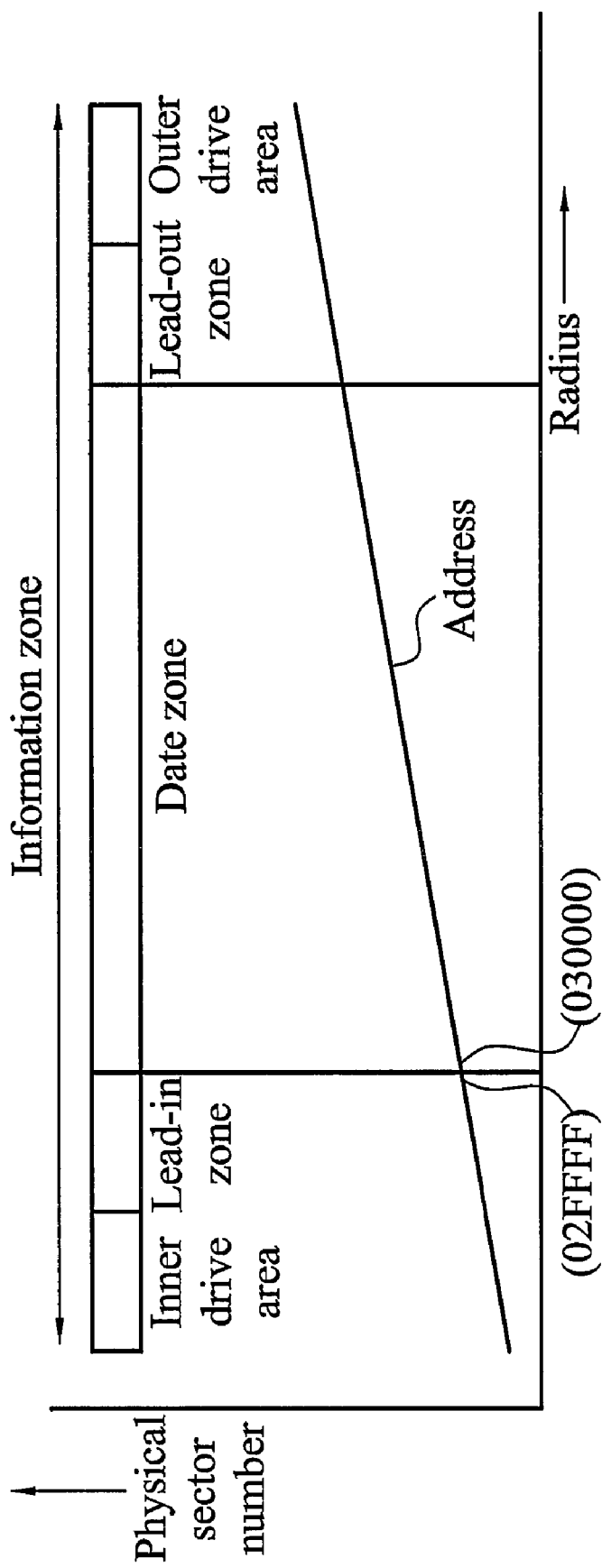
FIG. 4 is a cross-sectional diagram illustrating an optical medium.
Figure 5A:
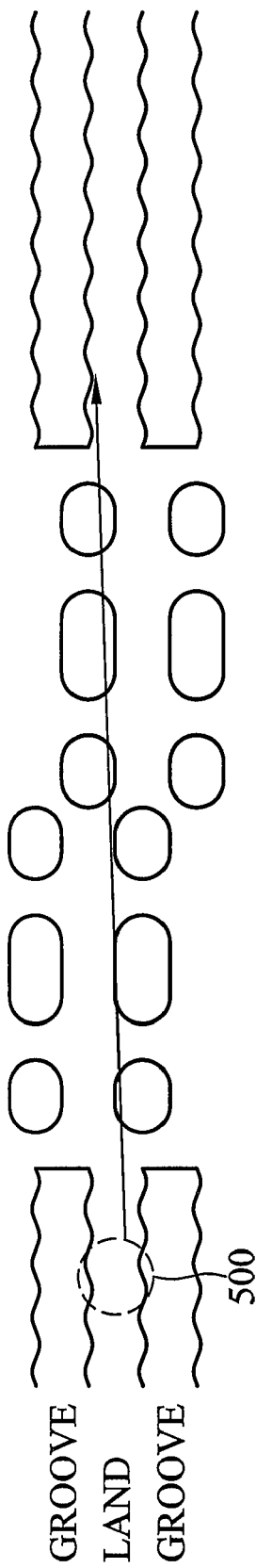
FIG. 5A shows the physical shape of the land track in a DVD-RAM disc.
Figure 5B:
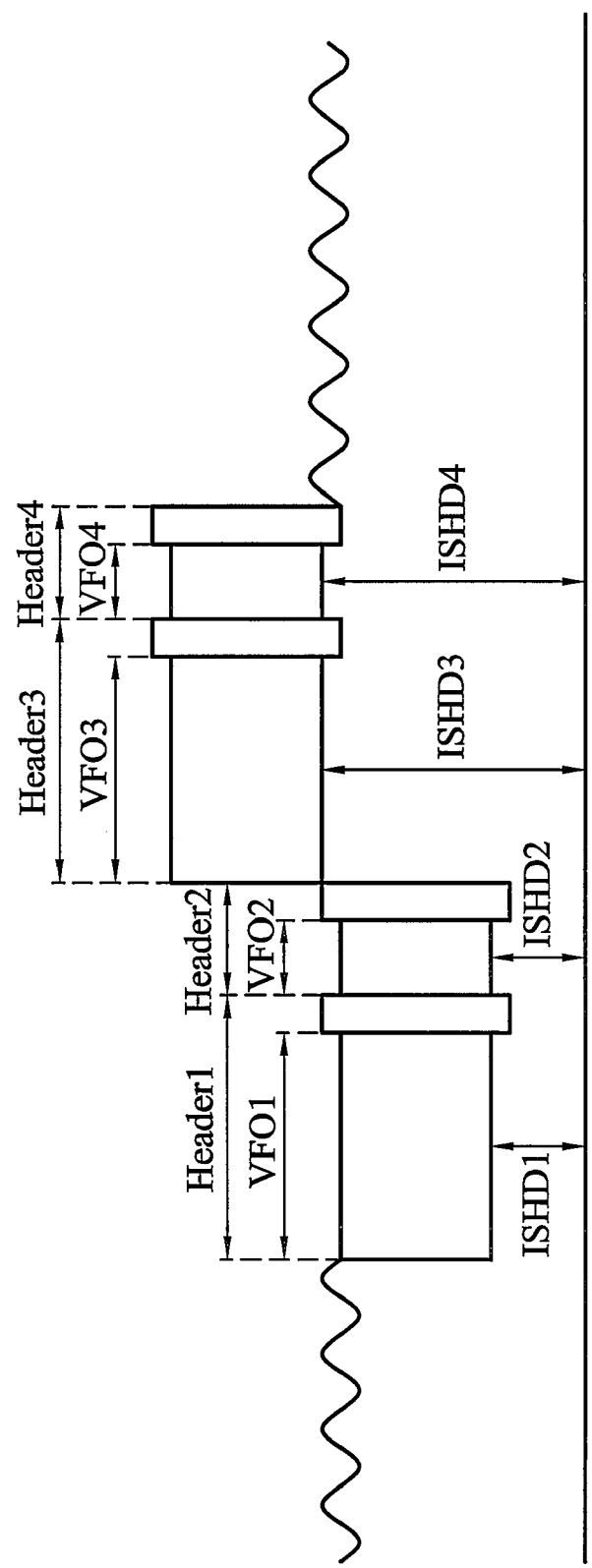
FIG. 5B shows the waveform of a Read channel 1 signal in the land track.

Another signal control loop, such as offset control loop, is formed by variable gain amplifier 202, digital converter 204, offset controller 210 and adder 212 for offset compensation. If the offset occurs, as shown in period t3 or t4 in FIG. 3, the threshold controller 1500 detects whether the peak level exceeds the positive high threshold +Hth, or the bottom level lower than the negative high threshold −Hth. If detected, a second control signal #ctrl2 is sent to increase the step size of offset controller 110, accelerating the convergence ratio of the offset control loop. An offset signal #offset is then generated based on the data signal #DATA and the adjusted step size, and an adder 212 is coupled to the output of offset controller 210, compensating the RF signal #RF by the offset signal #offset before sending the RF signal #RF to the variable gain amplifier 202.

Figure 16:
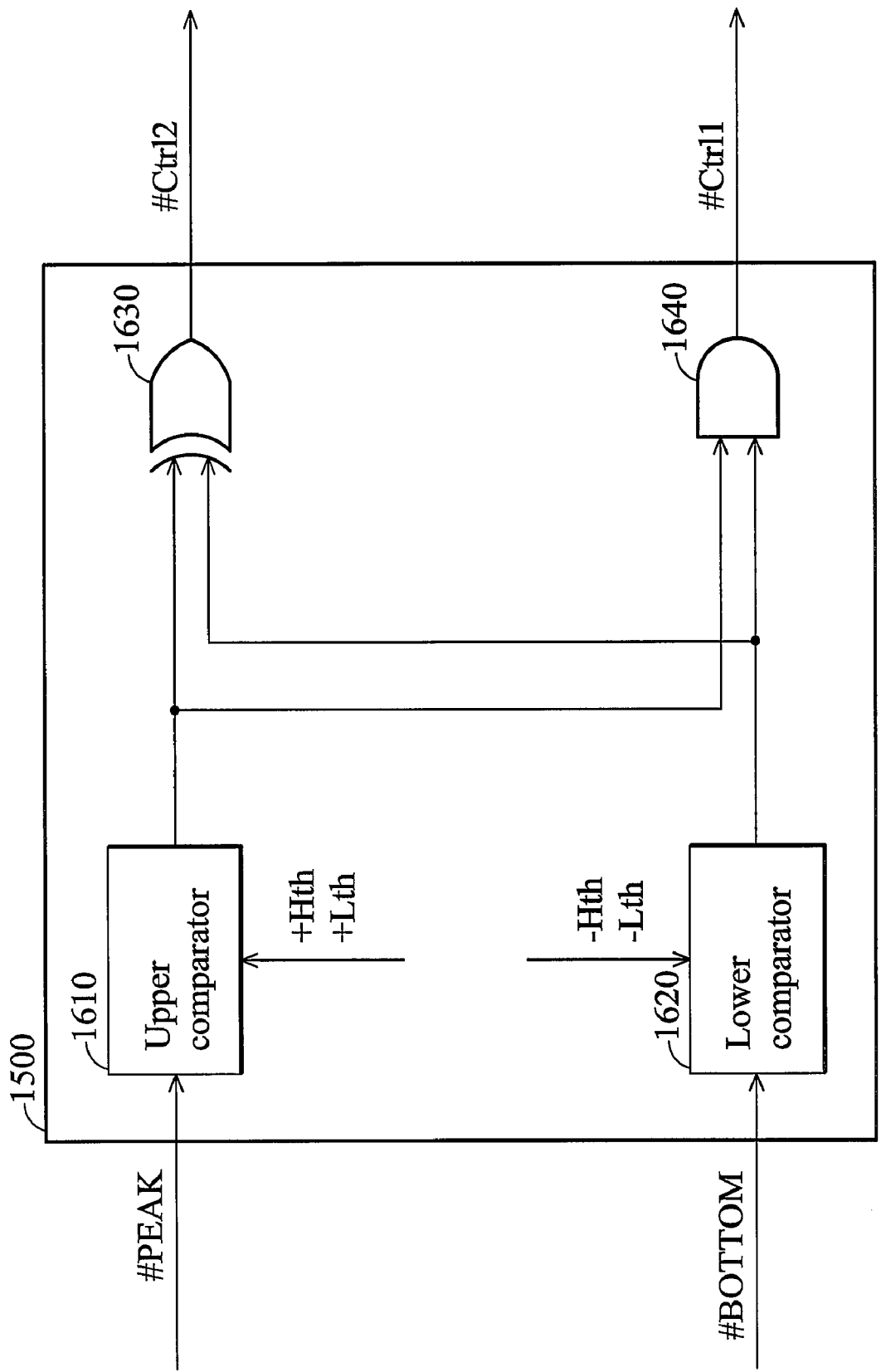
FIG. 16 shows an embodiment of the threshold controller 300 according to FIG. 15.

FIG. 16 shows an embodiment of the threshold controller 1500 according to FIG. 15. The threshold controller 1500 comprises an upper comparator 1610 and a lower comparator 1620, individually comparing the peak level with a positive high threshold +Hth, and the bottom level with a negative high threshold −Hth. If the peak level exceeds the positive high threshold +Hth, the upper comparator 1610 outputs a true value, otherwise a false value. A first mode controller 1640 is coupled to the outputs of upper comparator 1610 and lower comparator 1620. If the bottom level is more negative than the negative high threshold −Hth, the lower comparator 1620 outputs a true value, otherwise a false value. When over-amplification occurs, both upper comparator 1610 and lower comparator 1620 output true values, and the first mode controller 1640 outputs the first control signal #ctrl1 to the auto gain controller 208. Exemplarily, the first mode controller 1640 is an AND gate, and the first control signal #ctrl1 may be a digital bit of 0 and 1 for mode control, used to switch step size in the auto gain controller 108 between a turbo mode and a normal mode. If the first control signal #ctrl1 is a true value, i.e. value 1, turbo mode is indicated, and the step size in the auto gain controller 208 is set to a higher value. Conversely, a low value of the first control signal #ctrl1 induces a lower step size for normal mode. A second mode controller 1630 is also coupled to the outputs of upper comparator 1610 and lower comparator 1620. When offset occurs, one of the upper comparator 1610 and lower comparator 1620 outputs a true value, and the second mode controller 1630 outputs the second control signal #ctrl2 to the offset controller 210. In the embodiment, the second mode controller 1630 is a XOR gate. An alternative implementation may use an OR gate instead.

Additionally, the turbo mode may be enabled when amplitude of the data signal #DATA is too small. For example, the upper comparator 1610 further compares the peak level with a positive low threshold +Lth lower than the target level, and the lower comparator 1620 compares the bottom level with a negative low threshold −Lth less negative than the negative target level. If the peak level is below the positive low threshold +Lth, the upper comparator 1610 outputs a true value, otherwise a false value. Likewise, if the bottom level is less negative than the negative low threshold −Lth, the lower comparator 1620 outputs a true value, otherwise a false value. When amplitude of the data signal #DATA is too small, causing both upper comparator 1610 and lower comparator 1620 to output true values, turbo mode is activated by the first mode controller 1640 by outputting the first control signal #ctrl1 of true value to the auto gain controller 208. The positive low threshold +Lth and negative low threshold −Lth may also be used for offset compensation as well.

Figure 17:
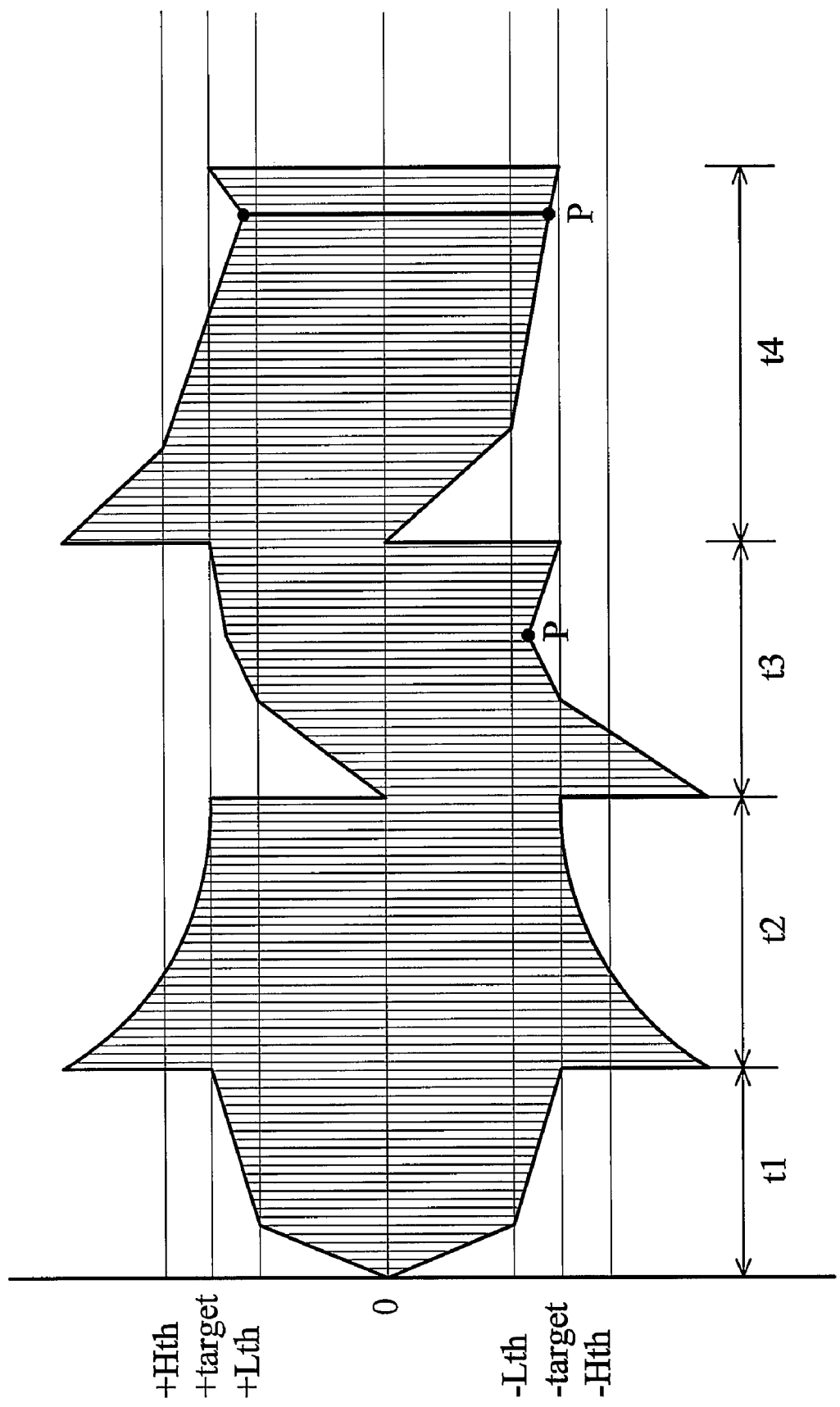
FIG. 17 shows a waveform of various conditions based on the embodiment of the invention.

FIG. 17 shows a waveform of various conditions based on the embodiment of the invention. Period t1 shows an under-amplified data signal #DATA. The data signal #DATA is gradually amplified to approximate the target level in two steps. When the peak value is below the positive low threshold +Lth, the auto gain controller 108 operates in turbo mode, and the slope of the envelope shown is sharper. Description is omitted for bottom values and negative low threshold −Lth due to symmetry thereof. As the amplitude of data signal #DATA grows and the peak value exceeds the positive low threshold +Lth, the gain control loop returns to normal mode, and the slope of the envelope flattens. The variation of step size helps the gain control loop to remain stable when amplitude is near the target level, while farther values converge more rapidly.

Period t2 shows an over-amplified data signal #DATA. The data signal #DATA is gradually de-amplified to approximate the target level in two steps. When the peak value exceeds the positive high threshold +Hth, the auto gain controller 108 operates in turbo mode, and the slope of the envelope shown is sharper. As the amplitude of data signal #DATA decreases and the peak value is lower than the positive high threshold +Hth, the gain control loop returns to normal mode, and the slope of the envelope flattens. For a specific example, the positive high threshold +Hth may be identical to the +target (and the negative high threshold −Hth identical to the −target), so the over-amplified data signal #DATA will be de-amplified in one mode, such as the turbo mode.

Period t3 shows a case of offset. The bottom value exceeds (being more negative than) the −target while the peak value is below the +target. The offset controller 210 in FIG. 15 adds the RF signal #RF with an offset signal #offset to compensate the offset. It is shown that the slope of the envelope where the bottom value exceeds the negative high threshold −Hth is sharper since the offset controller 210 is triggered by the second control signal #ctrl2 to operate in turbo mode. Alternatively, offset may occur in combination with over-amplification or under-amplification. Thus both of the auto gain controller 108 and offset controller 210 may operate together to approximate to the target level. Period t4 shows another example of offset. The peak level exceeds the +target while bottom value does not. The data signal #DATA is compensated in turbo mode until the peak level does not exceed the positive high threshold +Hth. Offset compensation keeps processing in normal mode until the time point P where offset is completely canceled. Thereafter, auto gain controller 108 is again activated to perform the gain control, the data signal #DATA is amplified to the target level as shown in the end of period t4.

Figure 18:
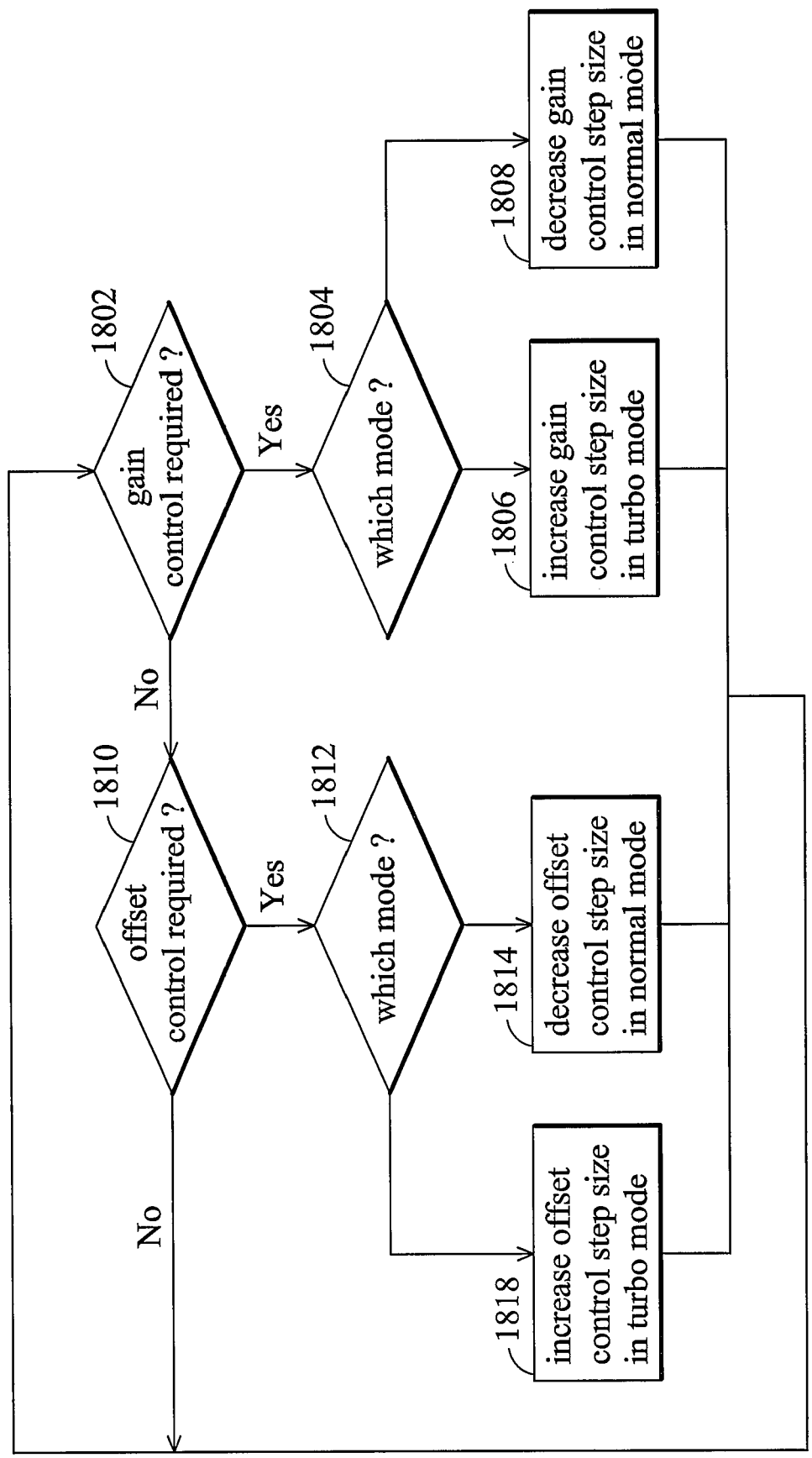
FIG. 18 is a flowchart of an embodiment of the loop control method.

FIG. 18 is a flowchart of an embodiment of a loop control method. In step 1802, the auto gain controller 208 determines whether gain control is required. If so, step 1804 is processed, detecting the peak and bottom levels to determine the operating mode. If both peak level exceeds positive high threshold +Hth and bottom exceeds negative high threshold −Hth, turbo mode is activated in step 1806, and the auto gain controller 208 operates with a higher step size to generate the gain value #gain. Otherwise in step 1808, the auto gain controller 208 operates in normal mode. Additionally in step 1806, turbo mode may be activated if the peak level is lower than the positive low threshold +Lth and the bottom level is lower than the negative low threshold −Lth. In step 1810, the offset controller 210 determines whether offset compensation is required. If so, step 1812 is processed to detect which operating mode to perform. If one of the peak and bottom levels exceeds the high thresholds +Hth/−Lth, turbo mode is activated in step 1818. Otherwise normal mode is processed in step 1814. When all steps are complete, the process returns to step 1802.

Figure 19:
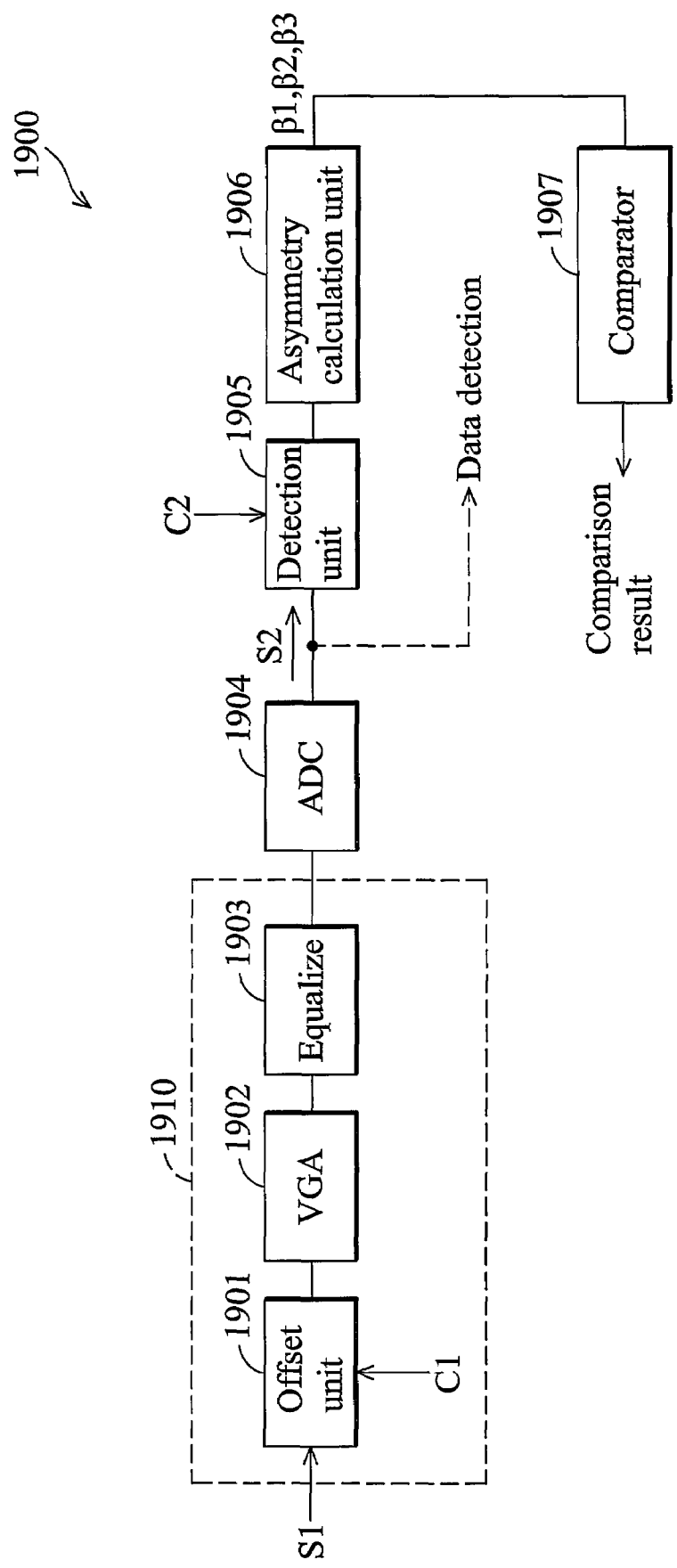
FIG. 19 is a diagram illustrating an asymmetry measurement apparatus according to a first embodiment of the invention.

Please refer to FIG. 19. FIG. 19 is a diagram illustrating an asymmetry measurement apparatus 1900 according to a first embodiment of the invention. The asymmetry measurement apparatus 1900 comprises a signal adjusting module 1910, an Analog to Digital Converter (ADC) 1904, a detection unit 1905, an asymmetry calculation unit 1906, and a comparator 1907. The signal adjusting module 1910 adjusts the recorded data reproduction signal S1. The ADC 1904 is coupled to the signal adjusting module 1910 for converting the adjusted recorded data reproduction signal S1 into a digital signal S2. The detection unit 1905 is coupled to the ADC 1904 for detecting plurality values of the digital signal S2 according to a control signal C2. That is, the detection unit 1905 detects the plurality values of the digital signal S2 when the control signal C2 is high, and the detection unit 1905 does not detect the plurality values of the digital signal S2 when the control signal C2 is low. The plurality values of the digital signal S2 comprises a peak value of the digital signal S2, a bottom value of the digital signal S2, and an average value of the digital signal S2. The asymmetry calculation unit 1906 is coupled to the detection unit 1905 for calculating asymmetry value according to the plurality values of the digital signal S2 detected by the detection unit 1905. The comparator 1907 compares the asymmetry value with a predetermined value P1 to generate a comparison result. The disc drive adjusts the emitted power level according to the comparison result.

The signal adjusting module 1910 comprises an offset unit 1901, a Variable Gain Amplifier (VGA) 1902, and an equalizer 1903. The offset unit 1901 is coupled between the recorded data reproduction signal S1 and the VGA 1902 for adjusting offset of the recorded data reproduction signal S1. The VGA 1902 is disposed for amplifying the recorded data reproduction signal S1. The equalizer 1903 is coupled to the output end of the VGA 1902 for equalizing the amplified recorded data reproduction signal S1. The operating bandwidth of the offset unit 1901 is adjustable and is adjusted according to the control signal C1. For example, when the control signal C1 is high, the operating bandwidth of the offset unit 1901 is set at a high frequency band, and when the control signal C1 is low, the operating bandwidth of the offset unit 1901 is set at a low frequency band.

The asymmetry value generated by the asymmetry calculation unit 1906 comprises a beta value for example. The beta value is generated according to the following formula: $\beta=(A_1+A_2)/(A_1-A_2)$, $A_1=PK-DC$ and $A_2=BT-DC$, wherein $\beta$ represents the beta value, PK represents the peak value, DC represents the average value, and BT represents the bottom value.

In addition, in another embodiment of the invention, the marks recorded on the track of the optical disc may have various lengths representing various data information. Thus, the recorded data reproduction signal S1 may have various physical features respectively representing the corresponding marks. For example, the peak value, bottom value or the average value of the recorded data reproduction signal S1 corresponding to the mark with shorter length (short_T_mark) may differ from that of the mark with longer length (long_T_mark). Therefore, the asymmetry value can be generated according to the following formula: asymmetry_value=$((PK_L+BT_L)/2-(PK_S+BT_S)/2)/(PK_L-BT_L)$, wherein $PK_L$ represents the peak value corresponding to the long_T_mark, $PK_S$ represents the peak value corresponding to the short_T_mark, and $BT_L$ represents the bottom value corresponding to the long_T_mark, $BT_S$ represents the bottom value corresponding to the short_T_mark. The long_T_mark, for example in a blu-ray disc, is a 8T mark on the optical disc. The short_T_mark, for example in a blu-ray disc, is a 2T mark on the optical disc.

Additionally, the digital signal S2 is also provided to the optical storage drive for data detection.

Figure 20:
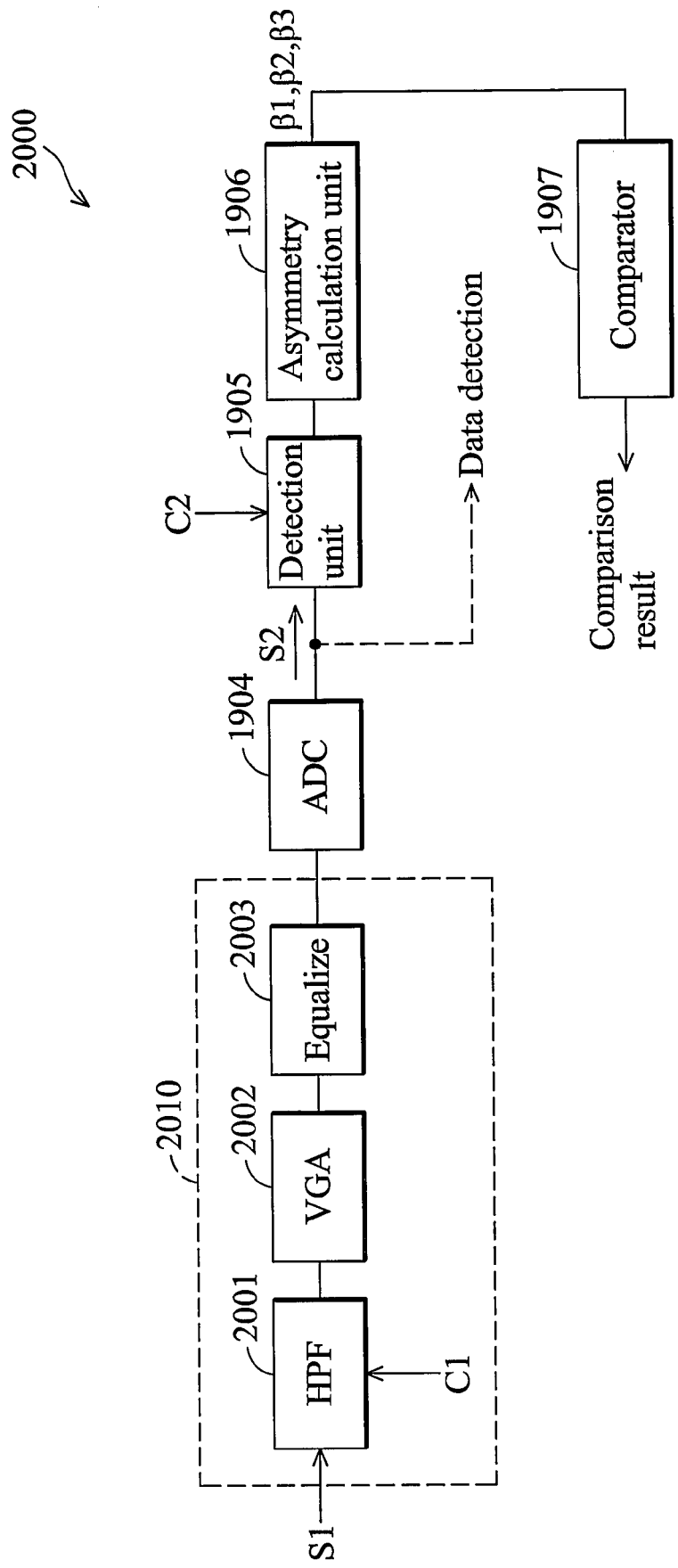
FIG. 20 is a diagram illustrating an asymmetry measurement apparatus according to a second embodiment of the invention.

Please refer to FIG. 20. FIG. 20 is a diagram illustrating an asymmetry measurement apparatus 2000 according to a second embodiment of the invention. The asymmetry measurement apparatus 2000 is similar with the asymmetry measurement apparatus 1900 in FIG. 19 except the signal adjusting module 1910 is replaced with the signal adjusting module 2010. The component denotes with the same numerical numbers operates in similar way and have similar functions. Thus, for the sake of brevity, the description of the components of FIG. 20 similar to those in FIG. 19 is omitted.

The signal adjusting module 2010 comprises a High-Pass Filter (HPF) 2001, a VGA 2002, and an equalizer 2003. The HPF 2001 is disposed for filtering the recorded data reproduction signal S1. The VGA 2002 is coupled to the HPF 2001 for amplifying the filtered recorded data reproduction signal S1. The equalizer 2003 is coupled to the VGA 2002 for equalizing the amplified recorded data reproduction signal S1. The operating bandwidth of the HPF 2001 is adjustable and is adjusted by the control signal C1. That is, the operating bandwidth of the HPF 2001 is set at a high frequency band when the control signal C1 is high, and the operating bandwidth of the HPF 2001 is set at a low frequency band when the control signal C1 is low.

Figure 21:
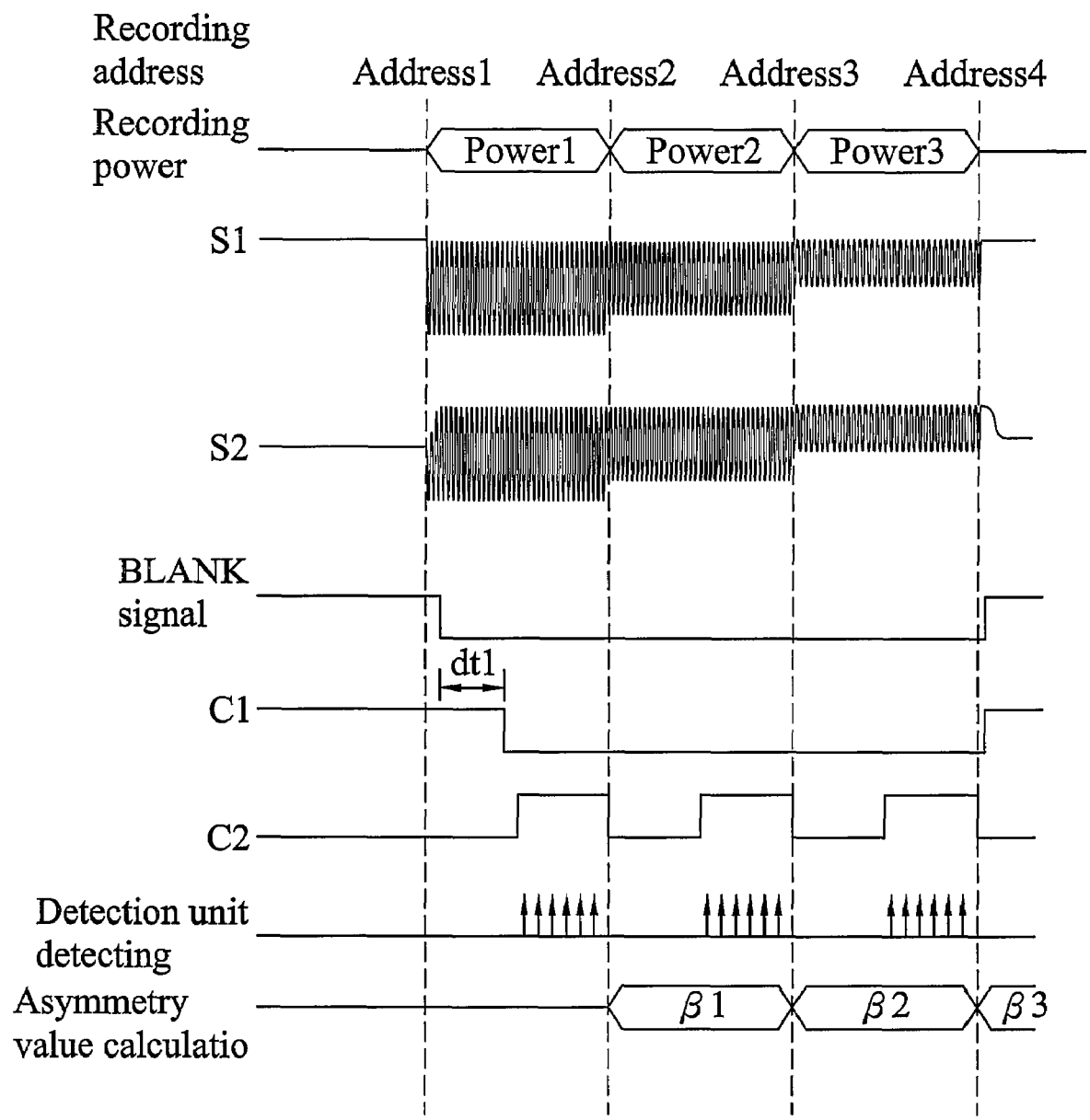
FIG. 21 is a first timing diagram illustrating the asymmetry measurement of the invention.

Please refer to FIG. 21. FIG. 21 is a first timing diagram illustrating the asymmetry measurement of the invention. In FIG. 21, the blank signal indicates the recorded data reproduction signals are generated from non-blank sectors, such as the data area, of the optical storage medium or not. That is, for example, when the blank signal b1 is low, meaning the recorded data reproduction signals are generated from the data area of the optical storage medium. When the blank signal b1 is high, meaning the recorded data reproduction signals are not generated from the data area of the optical storage medium. Thus, the control signal C1 can be generated according to the blank signal b1. In FIG. 21, the control signal C1 is set low after a first delay time interval dt1 when the blank signal b1 is low. In this way, the operating bandwidth of the offset unit 201 and the operating bandwidth of the HPF 2001 are set at low frequency bands after the first delay time interval dt1. Otherwise, the operating bandwidths of the offset unit 1901 and the HPF 2001 are set at high frequency bands.

The control signal C2 (address flag signal) is generated according to the address of the optical storage medium. In FIG. 21, the recorded data reproduction signals between address1 and address2 are captured corresponding to the marks which are recorded with a power level of power1, the recorded data reproduction signals between address2 and address3 are captured corresponding to the marks which are recorded with a power level of power2, and the recorded data reproduction signals between address3 and address4 are captured corresponding to the marks which are recorded with a power level of power3. Thus, the control signal C2 is set high after a delay time interval when the recorded data reproduction signal is generated. The control signal C2 is utilized to enable the detection unit 1905 for detecting the plurality values of the digital signal S2. In this way, the asymmetry value $\beta1$ corresponding to the power1, the asymmetry value $\beta2$ corresponding to the power2, and the asymmetry value $\beta3$ corresponding to the power3 are respectively generated.

Figure 22:
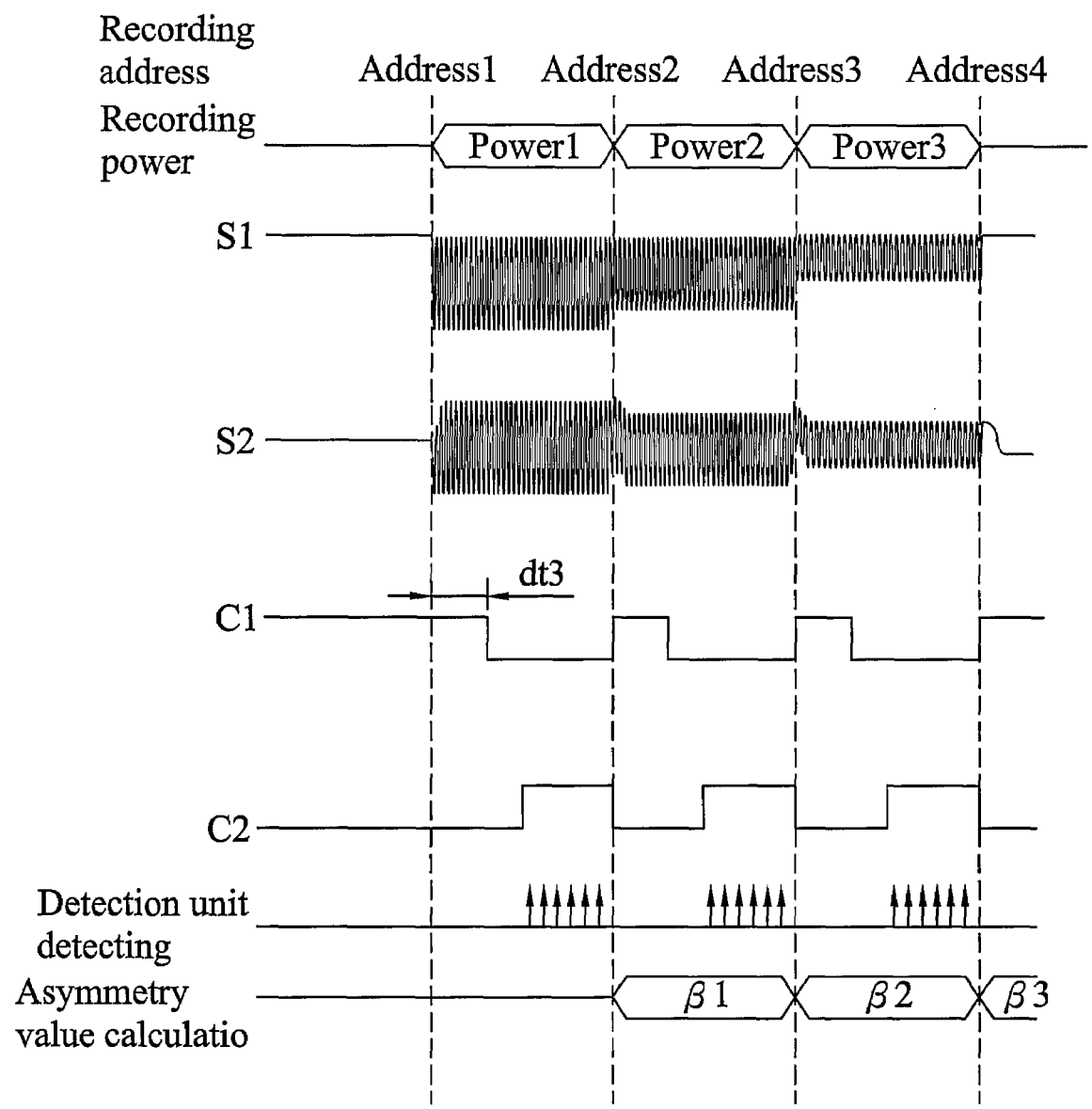
FIG. 22 is a second timing diagram illustrating the asymmetry measurement of the invention.

Please refer to FIG. 22. FIG. 22 is a second timing diagram illustrating the asymmetry measurement of the invention. The control signal C1 is generated according to the address of the optical storage medium. In FIG. 22, the recorded data reproduction signals between address1 and address2 are captured corresponding to the marks which are recorded with a power level of power1, the recorded data reproduction signals between address2 and address3 are captured corresponding to the marks which are recorded with a power level of power2, and the recorded data reproduction signals between address3 and address4 are captured corresponding to the marks which are recorded with a power level of power3. Thus, the control signal C1 is set low after a second delay time interval dt3 when the recorded data reproduction signal is generated. In this way, the operating bandwidth of the offset unit 1901 and the operating bandwidth of the HPF 2001 are set at low frequency bands when the control signal C1 is low. Otherwise, the operating bandwidths of the offset unit 1901 and the HPF 2001 are set at high frequency bands.

The control signal C2 (address flag signal) is also generated according to the address of the optical storage medium. Thus, the control signal C2 is set high after a delay when the recorded data reproduction signal is generated. The control signal C2 is utilized to enable the detection unit 1905 for detecting the plurality values of the signal S2. In this way, the asymmetry value $\beta1$ corresponding to the power1, the asymmetry value $\beta2$ corresponding to the power2, and the asymmetry value $\beta3$ corresponding to the power3 are respectively generated.

The spirit of the invention is to detect the plurality values of the recorded data reproduction signals and to calculate the asymmetry values in digital domain. Thus, the components for detecting and calculating can be designed easier.

The above described asymmetry measurement apparatus and method thereof are exemplary embodiments which utilized marks recorded with various power levels to generate reference reproduction signals for power level adjusting. It is not intended to limit this invention. The invention also can be performed during normal writing operation to adjust the write power level dynamically by recapturing the reproduction signal of previous recorded marks.

Figure 23:
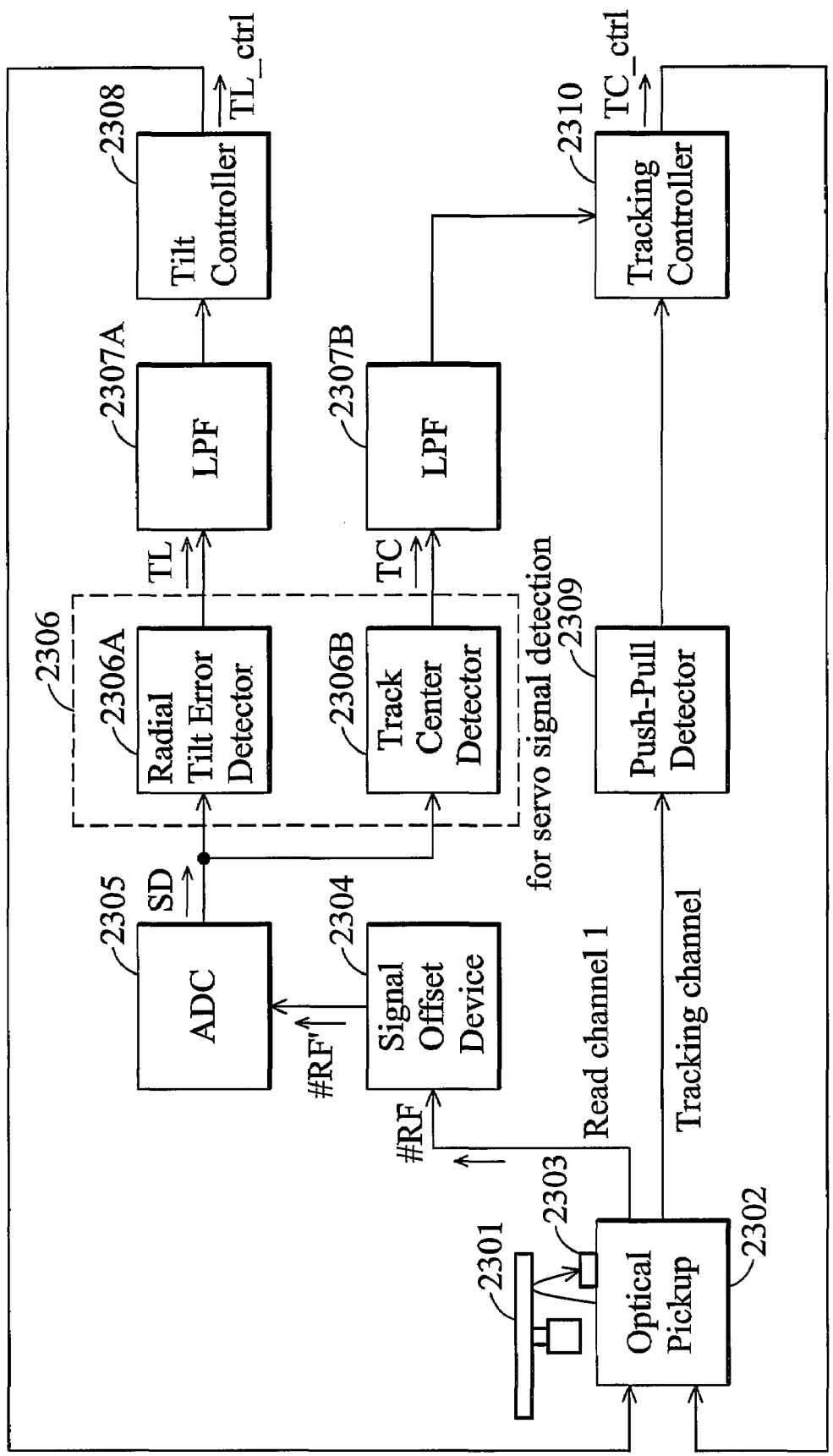
FIG. 23 is a block diagram of track center compensation and tilt control for an optical disc.

FIG. 23 is a block diagram of track center compensation and tilt control for an optical disc. The optical pickup 2302 has a split photo detector 2303 detecting the intensity of light and converting the detected intensity of light to electrical signals. The split photo detector 2303 can be divided into a predefined number of optical detecting elements.

As described, a DVD-RAM disc has signal tracks made up of lands and grooves, and data can be written/read on/from the tracks of both the lands and the grooves as well as either the land tracks or the groove tracks. Also, at the beginning position of each sector, header fields Header1 and Header2 and header fields Header3 and Header4 are staggered with respect to each other as shown in FIG. 7.

Thus, while setting the DVD-RAM disc 2301, or during the writing/reading operation, the laser beam emitted from a laser diode of optical pickup 2302 is directed onto the signal tracks of DVD-RAM disc 2301. Thus, a light spot with a predetermined state is provided to DVD-RAM disc 2301, and the beam reflected from the signal tracks of the DVD-RAM disc 2301 enters photo detector 2303. In addition, when the light spot passes through the header area (non-writable area) of DVD-RAM disc 2301, photo detector 2303 generates detection signal #RF according to the electrical signals output from optical detecting elements proportional to the intensity of light beam obtained from the respective optical detecting elements. Thus, detection signal #RF detected from Read channel 1 shown in FIG. 8 is obtained.

To convert the analog detection signal #RF to a digital signal by analog to digital converter (ADC) 2305, signal adjusting module 2304 is required to adjust the signal levels of detection signal #RF to within the operating range of ADC 2305, preferably to around the middle of the operating range. After adjusting detection signal #RF, an adjusted detection signal #RF' is generated by signal adjusting module 2304 and then provided to ADC 2305. In an embodiment of the invention, signal adjusting module 2304 have an offset control device. In another embodiment of the invention, signal adjusting module 2304 have a high pass filter (HPF). ADC 2305 converts the analog offset shifted detection signal #RF' to a digital signal SD. Detection circuit 2306, comprising radial tilt error detector 2306A and track center detector 2306B, detects the servo detection signal according to the detection of digital signal SD.

Figure 6A:
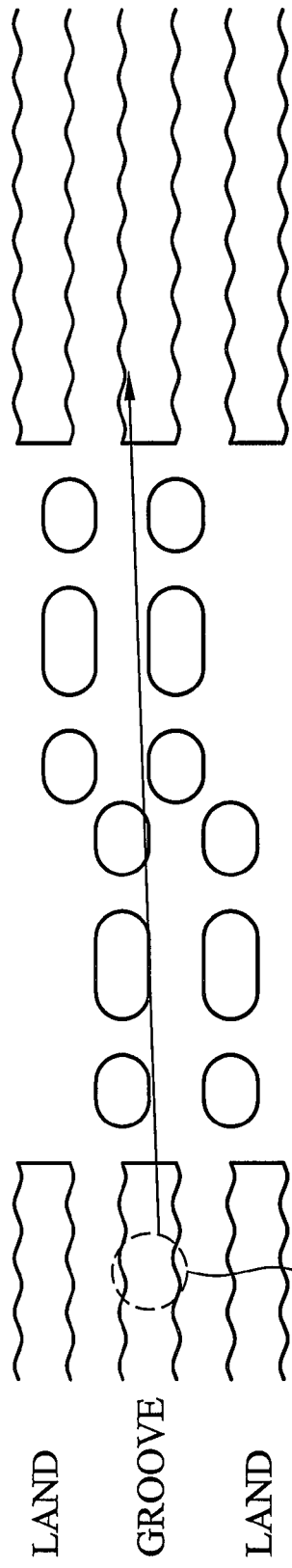
FIG. 6A shows the physical shape of the groove track in a DVD-RAM disc.
Figure 6B:
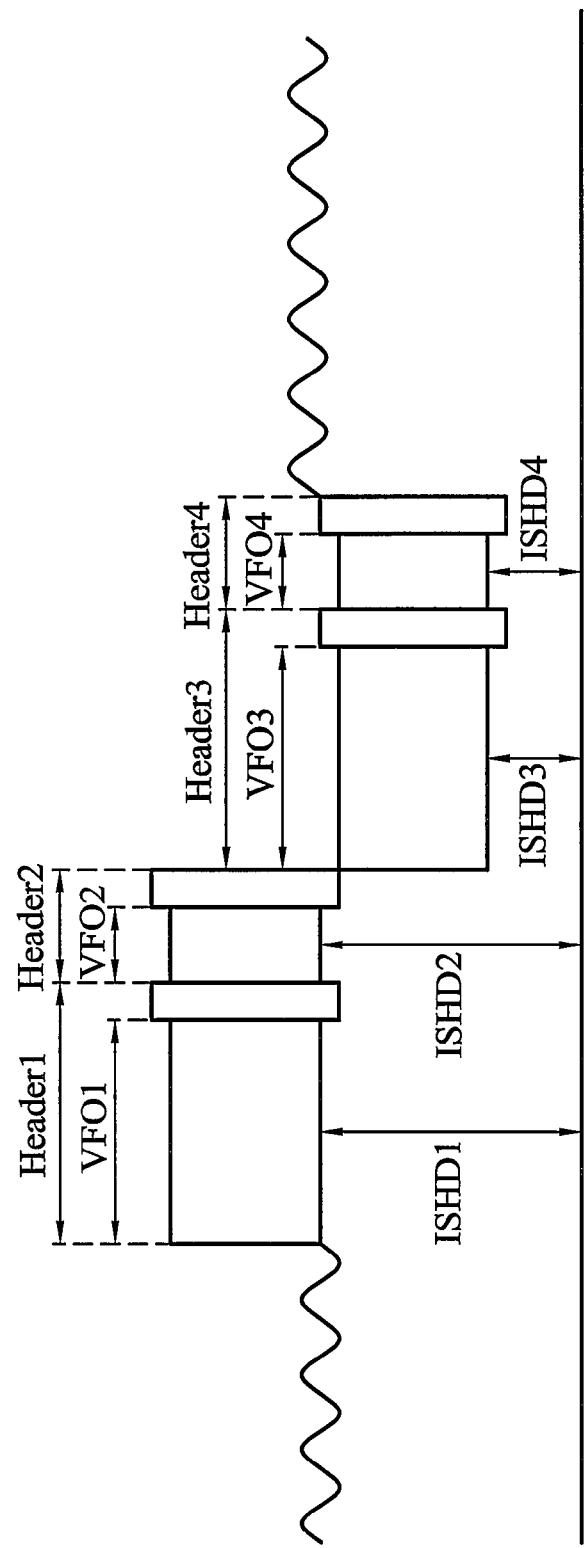
FIG. 6B shows the waveform of the Read channel 1 signal in the groove track.
Figure 9:
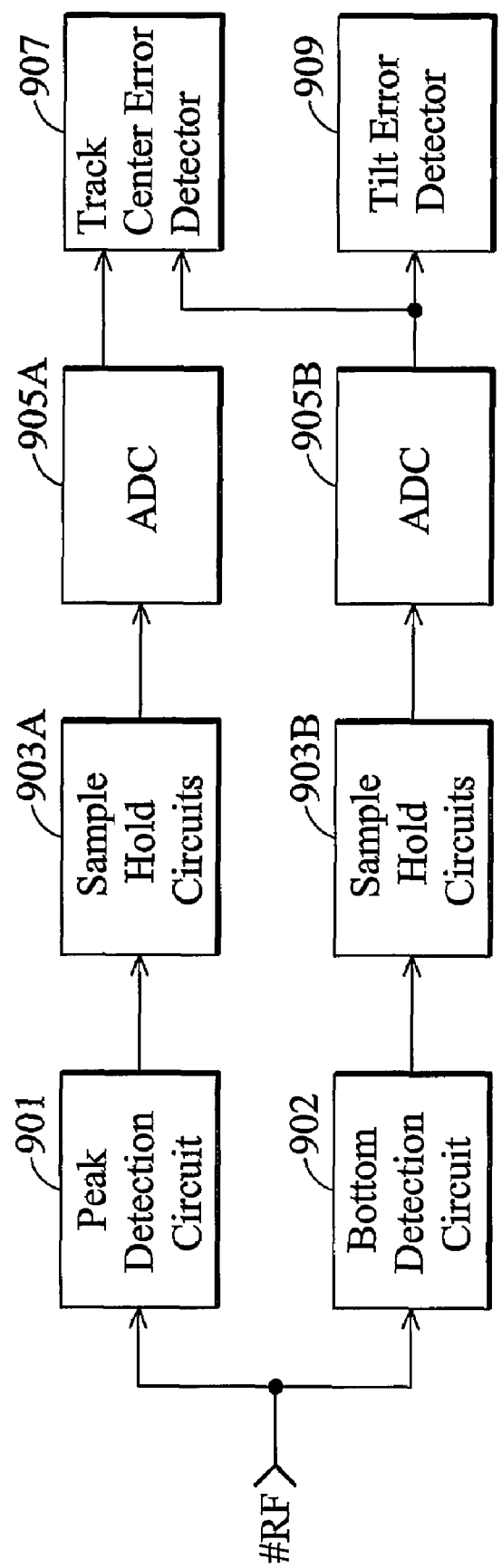
FIG. 9 shows a conventional apparatus detecting track center error and tilt error of a DVD-RAM disc.

The beam reflected from DVD-RAM disc 2301 can be deflected from a desired track due to a slant state, such as tilt, of DVD-RAM disc 2301 as well as the eccentricity. Radial tilt error detector 2306A detects DC bottom values of digital signal SD, and generates radial tilt error TL according to the detection. In an embodiment of the invention, radial tilt error TL can be obtained by formula (1):

$$TL = [(ISHD1+ISHD2)-(ISHD3+ISHD4)]/2I_0 \text{ at track center} \quad (1)$$

where ISHD1, ISHD2, ISHD3, and ISHD4 are respectively DC bottom values of VFO signals of fields Header 1, Header 2, Header3, and Header4 shown in FIG. 6B. And $I_0$ is DC level of Mirror field.

In another embodiment of the invention, radial tilt error TL can be obtained by formula (2) simplified from formula (1):

$$TL=ISHD1-ISHD3 \quad (2)$$

When the radial tilt error TL is obtained, radial tilt error detector 2306A outputs the radial tilt error TL. After filtering the radial tilt error TL by low pass filter (LPF) 2307A, the filtered radial tilt error TL is output to tilt controller 2308. Tilt controller 2308 generates control signal TL_ctrl to correct the incident angle of the light spot provided to DVD-RAM disc 2301 according to the filtered radial tilt error TL.

Tracking control involves detection of tracking error signals from electrical signals generated in accordance to the beam trace status and driving a tracking actuator in the optical pickup based on the tracking error signals to move an object lens of the optical pickup in the radial direction of the optical disc, thereby changing the position of the beam to trace a desired track. In an embodiment of the invention, push-pull detector 2309 receives detection signal from Tracking channel, and calculates the track error according to the detection signal from Tracking channel. To compensate the track error predicted by push-pull detector 2309, track center detector 2306B detects peak values and bottom values of digital signal SD output from ADC 2305, and generates track center error TC according to the detection. In an embodiment of the invention, track center error TC can be obtained by formula (3):

$$TC=(ISVFOHD1-ISVFOHD3)/(ISVFOHD1+ISVFOHD3) \quad (3)$$

where ISVFOHD1 and ISVFOHD3 are respectively amplitude of VFO signals of fields Header 1 and Header3 shown in FIG. 6B.

In another embodiment of the invention, track center error TC can be obtained by formula (4) simplified from formula (3):

$$TC=ISVFOHD1-ISVFOHD3 \quad (4)$$

When the track center error TC is obtained, track center detector 2306B outputs the track center error TC. After filtering the track center error TC by low pass filter 2307B, the filtered track center error TC is output to tracking controller 2310. Tracking controller 2310 generates control signal TC_ctrl to correct the position of the light spot provided to DVD-RAM disc 2301 according to the location of the track error calculated by push-pull detector 2309 and track center error TC.

Note radial tilt error TL and track center error TC are obtained according to VFO signals of fields Header 1 and Header3, where signals of fields Header 1 and Header3 are used since signal amplitudes in these fields are uniform and easy to detect. However, VFO signals of other fields in header area are also available for obtaining radial tilt error TL and track center error TC.

Figure 24A:
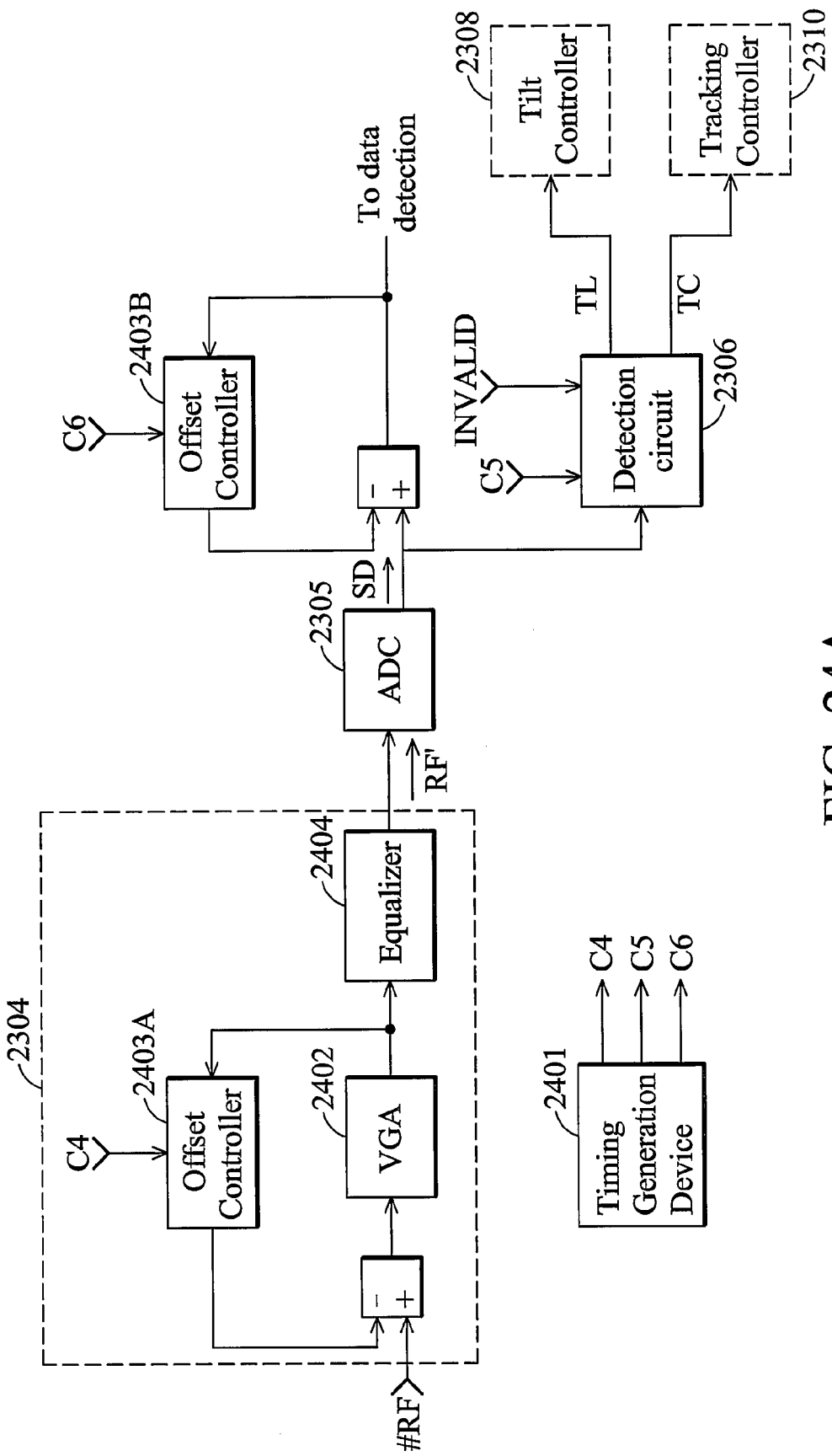
FIG. 24A is a block diagram of detection circuit and ADC according to an embodiment of the invention.

FIG. 24A is a block diagram of detection circuit 2306 and ADC 2305 according to an embodiment of the invention. Detection signal #RF is provided to signal adjusting module 2304 to adjust the signal levels of detection signal #RF to within the operating range of ADC 2305. The signal adjusting module comprises a variable gain controller (VGA) 2402, an offset controller 2403A and an equalizer 2404. Variable gain controller 2402 adjusts a gain of detection signal #RF. Offset controller 2403A shifts the signal level of the detection signal #RF to a range within the operating range of ADC 2305. And equalizer 2404 equalizing the detection signal #RF to generate the adjusted detection signal #RF'. Note that the operating bandwidth of offset controller 2403A is adjustable and is enabled by a control signal C4 provided from timing generation device 2401.

ADC 2305 converts the adjusted detection signal #RF' to digital signal SD for detection by detection circuit 2306. Detection circuit 2306 detects digital signal SD received from ADC 2305, and respectively generates tilt error TL and track center error TC to tilt controller 2308 and tracking controller 2310. Note that the detection operation of digital signal SD by detection circuit 2306 is enabled by an control signal C5 provided from timing generation device 2401. In addition, offset controller 2403B shifts digital signal SD to cancel signal offset between the junction of header fields Header2 and Header3 and other signal offset. After shifting by offset controller 2403B, digital signal SD is thus available for data detection. Here, the shifting of digital signal SD by offset controller 2403B is enabled by control signal C6 provided from timing generation device 2401. In addition, the tilt controller 2308 or the tracking controller 2310 are held or neglected in response to invalid signal INVALID.

Figure 24B:
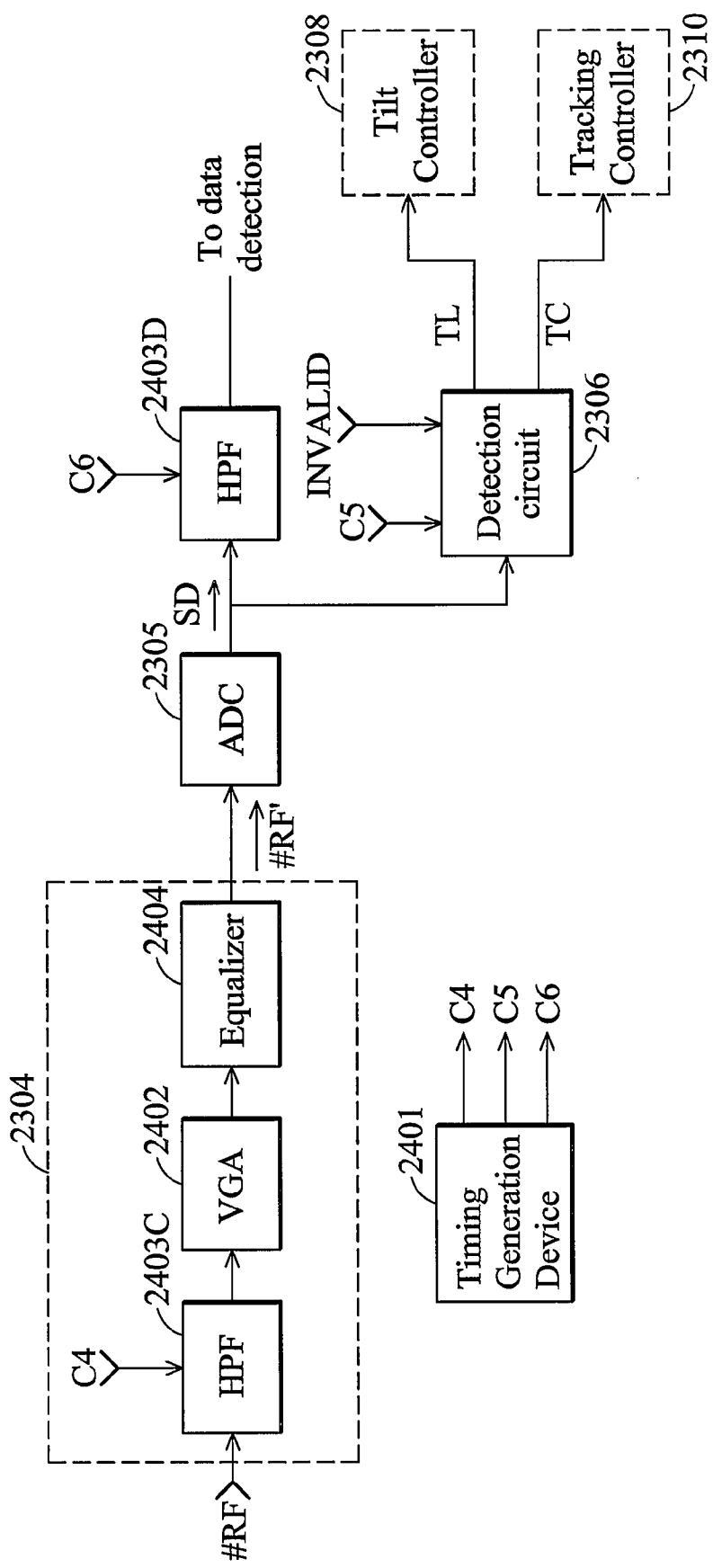
FIG. 24B is a block diagram of detection circuit and ADC according to an embodiment of the invention.

FIG. 24B is a block diagram of detection circuit 2306 and ADC 2305 according to another embodiment of the invention. Unlike FIG. 24A, offset controllers 2403A and 2403B are replaced by high pass filters 2403C and 2403D. The component denotes with the same numerical numbers operates in similar way and have similar functions. The operating bandwidth of the High pass filter 2403C is adjustable and is adjusted by the control signal C4 provided from timing generation device 2401. In addition, high pass filter 2403D shifts digital signal SD to cancel signal offset between header fields Header2 and Header3 and other signal offset. After shifting by high pass filter 2403D, digital signal SD is thus available for data detection. Here, the operating bandwidth of the high pass filter 2403D is adjustable and is adjusted by the control signal C6 provided from timing generation device 2401. In an embodiment of the invention, timing generation device 2401 may comprise timing generation units to generate control signals C4, C5, and C6 according to their predetermined waveform.

Figure 25:
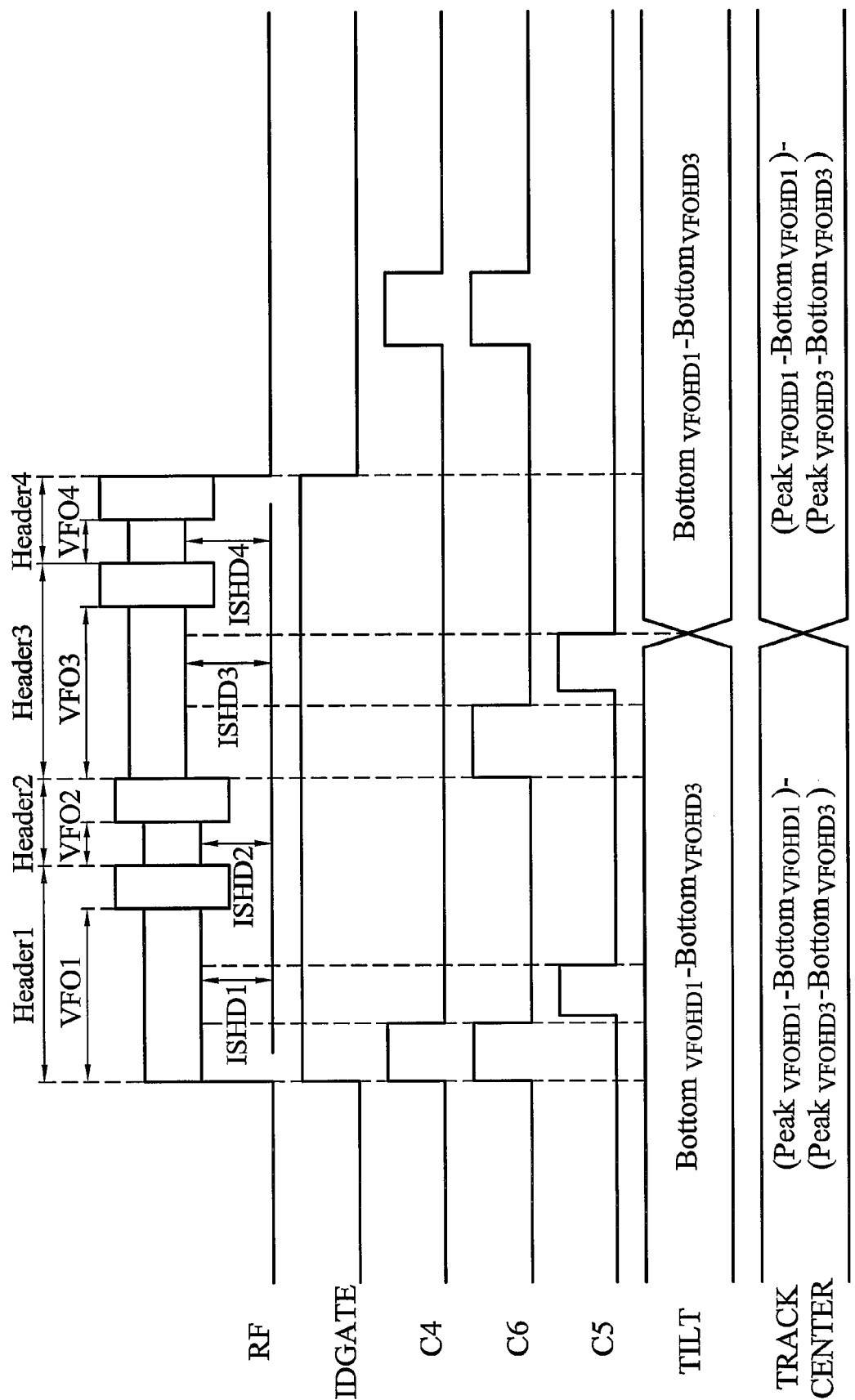
FIG. 25 is a timing chart of track center error and tilt error detection according to an embodiment of the invention.

FIG. 25 is a timing chart of track center error and tilt error detection according to an embodiment of the invention. Signal IDGATE is a header predict signal provided by timing generation device 2401. Optical pickup 2302 is on header area of DVD-RAM disc 2301 when signal IDGATE is at high logic level, and on data area when IDGATE at low logic level. In order to cancel the offset between data area and header area, the bandwidth of offset controller 2403A and high pass filter 2403C are switched to high operating bandwidth by control signal C4, and offset controller 2403B and high pass filter 2403D are switched to high operating bandwidth by control signal C6. When control signal C4 is at high logic level offset controller 2403A and high pass filters 2403C are set to operate at a high operating bandwidth, and is at low logic level offset controller 2403A and high pass filters 2403C are set to operate at a lower operating bandwidth. Control signal C6 is similar to control signal C4. Besides Header 1, the control signal C6 is also set at high logic level at the beginning of fields Header 3 to cancel the offset between fields Header 2 and Header 3 for data detection. Control signal C5 is at high logic level at VFO1 area and VFO3 area. The detection circuit 2306 is enabled to detect the peak values, bottom values and averaged values when control signal C5 is at high logic level. After VFO3 area is passed, track center error and tilt error are calculated.

Figure 26:
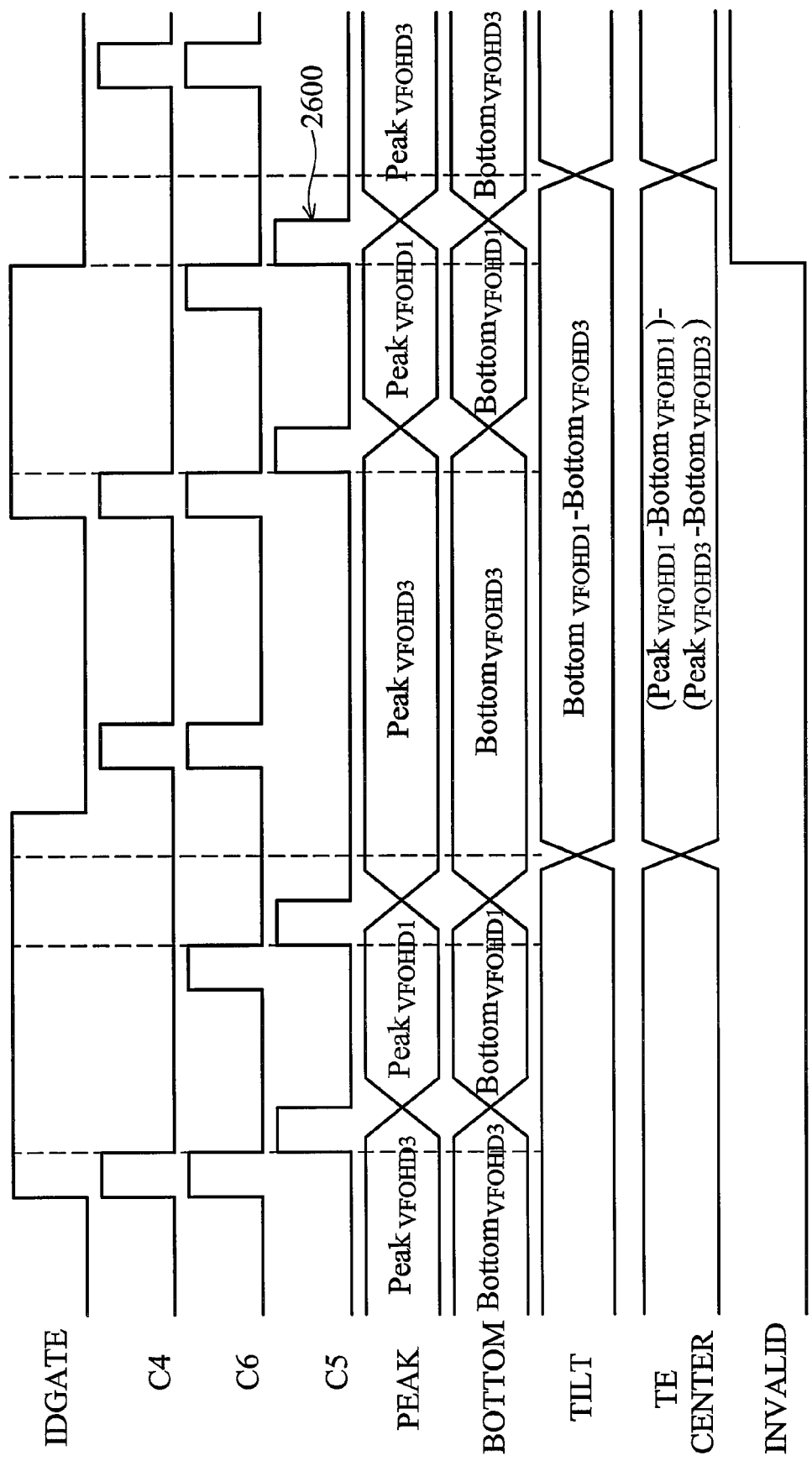
FIG. 26 is a timing chart of invalid signal INVALID for track center error and tilt error detection.

FIG. 26 is a timing chart of invalid signal INVALID for track center error and tilt error detection. If there detection errors occur, timing generation device 2401 asserts invalid signal INVALID and transmits it to tilt controller 2308 or tracking controller 2310 or neglect the detection result of radial tilt error detector 2306A and track center error detector 2306B. FIG. 26 shows an example of the detection error. If control signal C5 is asserted when signal IDGATE is at low logic level, denoted by numeral 2600, invalid signal INVALID is asserted to hold the tilt controller 2308 or track-ing controller 2310 or neglect the detection result of radial tilt error detector 2306A and track center error detector 2306B.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the invention shall be defined and protected by the following claims and their equivalents.

What is claimed is:

1. An electrical device performing loop control over a data signal, comprising:
   a variable gain amplifier, amplifying the data signal based on a gain value;
   a peak bottom detector, detecting a peak level and a bottom level corresponding to the amplified data signal;
   a threshold controller, coupled to the peak bottom detector, comparing the peak and bottom levels with a threshold value, and generating a first control signal accordingly;
   a signal control loop, coupled to the peak bottom detector, updating the gain value based on the peak and bottom levels with a first step size; wherein the first step size is determined by the first control signal.

2. The electrical device as claimed in claim 1, further comprising an analog to digital converter, coupled to the variable gain amplifier, sampling the amplified data signal output from the variable gain amplifier to generate a digital data signal; wherein the peak bottom detector detects peak and bottom levels of the digital data signal.

3. The electrical device as claimed in claim 1, wherein the signal control loop comprises an auto gain controller.

4. The electrical device as claimed in claim 3, wherein the threshold controller comprises:
   an upper comparator, comparing the peak level with a positive high threshold;
   a lower comparator, comparing the bottom level with a negative high threshold; and
   a first mode controller, coupled to the output of upper comparator and lower comparator; wherein:
   if the peak level exceeds the positive high threshold, the upper comparator outputs a true value, otherwise a false value;
   if the bottom level is more negative than the negative high threshold, the lower comparator outputs a true value, otherwise a false value; and
   if both upper comparator and lower comparator output true values, the first mode controller outputs the first control signal to the auto gain controller.

5. The electrical device as claimed in claim 4, wherein:
   the upper comparator further compares the peak level with a positive low threshold lower than the positive high threshold;
   the lower comparator further compares the bottom level with a negative low threshold less negative than the negative high threshold; and
   if the peak level is below the positive low threshold, the upper comparator outputs a true value, otherwise a false value;
   if the bottom level is less negative than the negative low threshold, the lower comparator outputs a true value, otherwise a false value; and
   if both upper comparator and lower comparator output true values, the first mode controller outputs the first control signal to the auto gain controller.

6. The electrical device as claimed in claim 5, wherein the first mode controller is an AND gate.

7. The electrical device as claimed in claim 5, wherein the auto gain controller increases the first step size to accelerate the gain control loop formed by the variable gain amplifier, analog to digital converter and auto gain controller.

8. The electrical device as claimed in claim 2, wherein the signal control loop comprises:
an offset controller, coupled to the analog to digital converter, generating an offset signal based on the digital data signal to cancel offset of the data signal; and
an adder, coupled to the output of offset controller and input of variable gain amplifier, updating the data signal by the offset signal before transmission to the variable gain amplifier; wherein:
the threshold controller generates a second control signal based on comparison results of the peak and bottom levels versus the threshold value; and
the offset signal is updated with a second step size determined by the second control signal.

9. The electrical device as claimed in claim 8, wherein the threshold controller comprises:
an upper comparator, comparing the peak level with a positive high threshold;
a lower comparator, comparing the bottom level with a negative high threshold; and
a mode controller, coupled to the output of upper comparator and lower comparator; wherein:
if the peak level exceeds the positive high threshold, the upper comparator outputs a true value, otherwise a false value;
if the bottom level is more negative than the negative high threshold, the lower comparator outputs a true value, otherwise a false value; and
if one of the upper comparator and lower comparator outputs a true value, the mode controller outputs the second control signal to the offset controller.

10. The electrical device as claimed in claim 9, wherein the mode controller is an OR or a XOR gate.

11. The electrical device as claimed in claim 9, wherein the offset controller increases the second step size to accelerate the offset control loop formed by the variable gain amplifier, analog to digital converter, offset controller and adder.

12. A loop control method for an electrical device receiving a data signal to generate a data signal, comprising:
amplifying the data signal based on a gain value;
detecting a peak level and a bottom level corresponding to the amplified data signal;
comparing the peak and bottom levels with a threshold value; and
performing loop control over the data signal based on the comparison result, wherein the loon control over the data signal comprises:
calculating a first step size based on the comparison result; and
updating the gain value with the first step size.

13. The loop control method as claimed in claim 12, further comprising sampling the amplified data signal to generate a digital data signal; wherein the peak and bottom levels are detected from the digital data signal.

14. The loop control method as claimed in claim 12, wherein the comparison comprises:
comparing the peak level with a positive high threshold;
comparing the bottom level with a negative high threshold;
if the peak level exceeds the positive high threshold, and the bottom level is more negative than the negative high threshold, setting a first control signal to a true value.

15. The loop control method as claimed in claim 14, wherein the comparison further comprises:
comparing the peak level with a positive low threshold lower than the positive high threshold;
comparing the bottom level with a negative low threshold less negative than the high threshold; and
if the peak level is below the positive low threshold, and the bottom level is less negative than the negative low threshold, setting the first control signal to a true value.

16. The loop control method as claimed in claim 15, further comprising, if the first control signal is a true value, increasing the first step size to accelerate the update of the gain value.

17. The loop control method as claimed in claim 12, wherein the loop control over the data signal comprises:
detecting offset of the data signal and generating an offset signal correspondingly;
generating a second control signal based on comparison results of the peak and bottom levels versus the threshold value;
updating the offset signal with a second step size determined by the second control signal; and
adding the data signal with the offset signal before amplifying the data signal.

18. The loop control method as claimed in claim 17, wherein generation of the second control signal comprises:
comparing the peak level with a positive high threshold;
comparing the bottom level with a negative high threshold; and
if the peak level exceeds the positive high threshold, or the bottom level is more negative than the negative high threshold, setting the second control signal to a true value.

19. An electronic device performing loop control over a data signal, comprising:
a variable gain amplifier having a gain value for amplifying the data signal to generate an amplified data signal;
a peak bottom detector for detecting a peak level and a bottom level corresponding to the amplified data signal;
a threshold controller, coupled to the peak bottom detector, for generating a first control signal according to the peak level, the bottom level and a threshold value; and
a signal controller, receiving the peak level, the bottom level and the first control signal, for updating the gain value with a first step size; wherein the first step size is determined according to the first control signal.

20. The electronic device as claimed in claim 19, further comprising an analog to digital converter, coupled to the variable gain amplifier, sampling the amplified data signal to generate a digital data signal; wherein the peak bottom detector detects peak and bottom levels of the digital data signal.

21. The electronic device as claimed in claim 19, wherein the threshold controller comprises:
an upper comparator, comparing the peak level with a positive high threshold;
a lower comparator, comparing the bottom level with a negative high threshold; and
a first mode controller, coupled to output of the upper comparator and the lower comparator; wherein,
if the peak level exceeds the positive high threshold, the upper comparator outputs a true value, otherwise a false value;
if the bottom level is more negative than the negative high threshold, the lower comparator outputs a true value, otherwise a flase value; and
if both the upper comparator and the lower comparator output the true value, the first mode controller outputs the first control signal having a true value to the signal controller.

22. The electronic device as claimed in claim 21, wherein:
the upper comparator further compares the peak level with a positive low threshold having a lower level than the positive high threshold; and
the lower comparator further compares the bottom level with a negative low threshold having less negative level than the negative high threshold; wherein,
if the peak level is below the positive low threshold, the upper comparator outputs a true value, otherwise a false value;
if the bottom level is less negative than the negative low threshold, the lower comparator outputs a true value, otherwise a false value; and
if both the upper comparator and the lower comparator output the true value, the first mode controller outputs the first control signal having a true value to the signal controller.

23. The electronic device as claimed in claim 21, wherein the first mode controller is an AND gate.

24. The electronic device as claimed in claim 19, wherein the signal controller comprises an auto gain controller.

25. The electronic device as claimed in claim 24, wherein, according to the first control signal, the auto gain controller increases the first step size to accelerate the gain control loop formed by the variable gain amplifier, an analog to digital converter, and the auto gain controller.

26. The electronic device as claimed in claim 19, wherein the threshold controller generates the first control signal by comparing the peak and bottom levels with the threshold value.

27. A loop control method for an electronic device, wherein the electronic device receives a data signal, comprising the following steps:
amplifying the data signal with a gain value to generate an amplified data signal;
detecting a peak level and a bottom level corresponding to the amplified data signal;
generating a first control signal according to the peak level, the bottom level and a threshold value; and
updating the gain value with a first step size; wherein the first step size is determined according to the first control signal.

28. The loop control method as claimed in claim 27, further comprising sampling the amplified data signal to generate a digital data signal; wherein the peak and bottom levels are detected from the digital data signal.

29. The loop control method as claimed in claim 27, wherein the step of generating a first control signal comprises:
comparing the peak level with a positive high threshold;
comparing the bottom level with a negative high threshold; and
if the peak level exceeds the positive high threshold, and the bottom level is more negative than the negative high threshold, setting the first control signal to a true value.

30. The loop control method as claimed in claim 29, wherein the step of generating a first control signal further comprises:
comparing the peak level with a positive low threshold having a lower level than the positive high threshold;
comparing the bottom level with a negative low threshold having less negative level than the negative high threshold; and
if the peak level is below the positive low threshold, and the bottom level is less negative than the negative low threshold, setting the first control signal to a true value.

31. The loop control method as claimed in claim 30, further comprising, if the first control signal is a true value, increasing the first step size to accelerate updating of the gain value.

32. The loop control method as claimed in claim 27, wherein the step of generation of the first control signal comprises comparing the peak and bottom levels with the threshold value.

33. An electronic device performing loop control over a data signal, comprising:
an offset adjustment unit for adjusting the data signal by an offset value to generate an adjusted data signal;
a peak bottom detector for detecting a peak level and a bottom level corresponding to the adjusted data signal;
a threshold controller, coupled to the peak bottom detector, for generating a control signal according to the peak level, the bottom level and a threshold value; and
a signal controller, receiving the control signal, for updating the offset value with a step size; wherein the step size is determined according to the control signal.

34. The electronic device as claimed in claim 33, wherein the threshold controller comprises:
an upper comparator, comparing the peak level with a positive high threshold;
a lower comparator, comparing the bottom level with a negative high threshold; and
a mode controller, coupled to output of the upper comparator and the lower comparator; wherein,
if the peak level exceeds the positive high threshold, the upper comparator outputs a true value, otherwise a false value;
if the bottom level is more negative than the negative high threshold, the lower comparator outputs a true value, otherwise a false value; and
if one of the upper comparator and the lower comparator outputs the true value, the mode controller outputs the control signal having a true value to the signal controller.

35. The electronic device as claimed in claim 34, wherein the mode controller is an OR or a XOR gate.

36. The electronic device as claimed in claim 33, wherein the signal controller comprises an offset controller.

37. The electronic device as claimed in claim 36, wherein, according to the control signal, the offset controller increases the step size to accelerate the offset control loop formed by the offset adjustment unit, an analog to digital converter, and the offset controller.

38. The electronic device as claimed in claim 33, wherein the offset adjustment unit comprises an adder.

39. A loop control method for an electronic device, wherein the electronic device receives a data signal, comprising the following steps:
adjusting the data signal by an offset value to generate an adjusted data signal;
detecting a peak level and a bottom level corresponding to the adjusted data signal;
generating a control signal according to the peak level, the bottom level and a threshold value;
updating the offset value with a step size; wherein the step size is determined according to the control signal.

40. The loop control method as claimed in claim 39, further comprising:
sampling the adjusted data signal to generate a digital data signal; wherein the peak and bottom levels are detected from the digital data signal.

41. The loop control method as claimed in claim 39, wherein the step of generating the control signal comprises:
comparing the peak level with a positive high threshold;

comparing the bottom level with a negative high threshold; and if the peak level exceeds the positive high threshold or the bottom level is more negative than the negative high threshold, setting the control signal to a true value.

42. The loop control method as claimed in claim 41, further comprising, if the control signal is a true value, increasing the step size to accelerate updating the offset value.

* * * * *